(12) United States Patent
Cantoro et al.

(10) Patent No.: US 10,020,396 B2
(45) Date of Patent: Jul. 10, 2018

(54) INTEGRATED CIRCUIT DEVICES AND METHODS OF MANUFACTURING THE SAME

(71) Applicant: Samsung Electronics Co., Ltd., Suwon-si, Gyeonggi-do (KR)

(72) Inventors: Mirco Cantoro, Suwon-si (KR); Yeon-cheol Heo, Suwon-si (KR); Maria Toledano Luque, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 9 days.

(21) Appl. No.: 15/350,686

(22) Filed: Nov. 14, 2016

(65) Prior Publication Data

US 2017/0345927 A1 Nov. 30, 2017

(30) Foreign Application Priority Data

May 26, 2016 (KR) .......................... 10-2016-0064936

(51) Int. Cl.
*H01L 27/12* (2006.01)
*H01L 29/78* (2006.01)
*H01L 21/306* (2006.01)
*H01L 29/04* (2006.01)
*H01L 29/06* (2006.01)
*H01L 29/08* (2006.01)
*H01L 29/10* (2006.01)
*H01L 29/207* (2006.01)
(Continued)

(52) U.S. Cl.
CPC .... *H01L 29/7827* (2013.01); *H01L 21/30612* (2013.01); *H01L 29/045* (2013.01); *H01L 29/0676* (2013.01); *H01L 29/0847* (2013.01); *H01L 29/1037* (2013.01); *H01L 29/207* (2013.01); *H01L 29/42376* (2013.01); *H01L 29/66522* (2013.01); *H01L 29/66666* (2013.01)

(58) Field of Classification Search
CPC ......... H01L 21/823487; H01L 27/2454; H01L 24/27; H01L 25/50; H01L 23/642; H01L 29/045; H01L 29/7827
See application file for complete search history.

(56) References Cited

U.S. PATENT DOCUMENTS 8,969,934 B1 3/2015 Cheng et al.
9,209,271 B1 12/2015 Lee et al.
2010/0052055 A1 3/2010 Takeuchi
(Continued)

OTHER PUBLICATIONS

Algra et al. "Twinning Superlattices in Indium Phosphide Nanowires" Nature, vol. 456, 20, Nov. 2008, pp. 369-372.
(Continued)

*Primary Examiner* — Joseph C Nicely
*Assistant Examiner* — Wilner Jean Baptiste
(74) *Attorney, Agent, or Firm* — Myers Bigel, P.A.

(57) ABSTRACT

An integrated circuit device may include a substrate including a main surface, a compound semiconductor nanowire extending from the main surface in a first direction perpendicular to the main surface and including a first section and a second section alternately arranged in the first direction, a gate electrode covering the first section, and a gate dielectric layer between the first section and the gate electrode. The first section and the second section may have the same composition as each other and may have different crystal phases from each other.

15 Claims, 35 Drawing Sheets

(51) Int. Cl.
*H01L 29/423* (2006.01)
*H01L 29/66* (2006.01)

(56) References Cited

U.S. PATENT DOCUMENTS

| | | | |
|---|---|---|---|
| 2010/0187503 A1* | 7/2010 | Moriyama | B82Y 10/00 257/24 |
| 2011/0233512 A1 | 9/2011 | Yang et al. | |
| 2012/0267604 A1* | 10/2012 | Tian | B82Y 10/00 257/9 |
| 2014/0353593 A1 | 12/2014 | Smets | |
| 2015/0236105 A1 | 8/2015 | Masuoka et al. | |
| 2015/0295040 A1 | 10/2015 | Tsai et al. | |
| 2015/0364560 A1 | 12/2015 | Wang et al. | |
| 2015/0372149 A1 | 12/2015 | Colinge et al. | |
| 2015/0380539 A1 | 12/2015 | Colinge et al. | |
| 2016/0027898 A1 | 1/2016 | Chuang et al. | |
| 2016/0042966 A1 | 2/2016 | Kelly et al. | |
| 2016/0049391 A1 | 2/2016 | Colinge et al. | |
| 2016/0049472 A1 | 2/2016 | Yu et al. | |
| 2016/0064541 A1 | 3/2016 | Diaz et al. | |

OTHER PUBLICATIONS

Berg et al. "Self-Aligned, Gate-Last Process for Vertical InAs Nanowire MOSFETs on Si", Published in Electron Devices Meeting IEDM), 2015 IEEE International, Date of Conference: Dec. 7-9, 2015, Date Added to IEEE Xplore: Feb. 18, 2016, Accession No. 15800877, Publisher: IEEE, 3 pages.

Caroff et al. "Controlled Polytypic and Twin-Plane Superlattices in III-v Nanowires" Nature Nanotechnology, Published Online: Nov. 30, 2008, DOI: 10.1038/NNAN0.2008.359, pp. 1-6.

Fülöp et al. "Wet Etch Methods for InAs Nanowire Patterning and Self-Aligned Electrical Contacts", Department of Physics, Budapest University of Technology and Economics, and Condensed Matter Research Group of the Hungarian Academy of Sciences, Budafoki ú8, 111 Budapest, Hungary, Department of Physics, University of Basel, Klingelbergstrasse 82, CH-4056 Basel, Switzerland; Center for Quantum Devices & Nano-Science Center, Niels Bohr Institute, University of Copenhagen, Universitetsparken 5, DK-2100 Copenhagen, Denmark; arXiv:1601.01562v1 [cond-mat.mes-hall] Jan. 7, 2016, pp. 1-9.

Zhai et al. "High-Performance Vertical Gate-All-Around Silicon Nanowire FET with High-κ/Metal Gate" IEEE Transactions on Electron Devices, vol. 61, No. 11, Nov. 2014, pp. 3896-3900.

* cited by examiner

B - B'

C - C'

B - B'

C – C'

C - C'

B - B'

C - C'

B - B'

C - C'

US 10,020,396 B2

INTEGRATED CIRCUIT DEVICES AND METHODS OF MANUFACTURING THE SAME

CROSS-REFERENCE TO RELATED APPLICATION

This U.S. non-provisional application claims priority under 35 U.S.C. § 119 to Korean Patent Application No. 10-2016-0064936, filed on May 26, 2016, in the Korean Intellectual Property Office, the entire content of which is incorporated by reference herein.

BACKGROUND

The inventive concepts relate to integrated circuit devices and methods of manufacturing the same, and, more particularly, to integrated circuit devices including a compound semiconductor nanowire and methods of manufacturing the same.

As the integration density of semiconductor devices increases, there have been efforts to improve the performance of transistors by using various materials such as strained channels, high-k dielectric layers, and metal gates. However, as the gate length of transistors gradually decreases, the reliability and performance of integrated circuit devices utilizing these transistors can be affected.

SUMMARY

The inventive concepts provide integrated circuit devices capable of realizing high reliability and performance by providing transistors having a precisely controlled gate length.

The inventive concepts also provide methods of manufacturing integrated circuit devices, whereby a transistor having a precisely controlled gate length may be manufactured through a low-cost, simple process.

According to an aspect of the inventive concepts, an integrated circuit device may include a substrate including a main surface a compound semiconductor nanowire extending from the main surface in a first direction perpendicular to the main surface and including a first section and a second section alternately arranged in the first direction, a gate electrode covering the first section, and a gate dielectric layer between the first section and the gate electrode. The first section and the second section have the same composition as each other and have different crystal phases from each other.

According to another aspect of the inventive concepts, a method of manufacturing an integrated circuit device may include forming a compound semiconductor nanowire extending from a main surface of a substrate in a first direction perpendicular to the main surface and comprising a first section and a pair of second sections alternately arranged in the first direction so that respective ones of the pair of second sections adjoin both ends of the first section, with the first section between the respective ones of the pair of second sections, decreasing a width of the first section by selectively etching the first section from among the first section and the pair of second section in the compound semiconductor nanowire and preparing a space having a vertical length limited by the respective ones of the pair of second sections, and forming a gate dielectric layer and a gate electrode in the space. The first section and the second section have the same composition as each other and have different crystal phases from each other.

According to another aspect of the inventive concepts, an integrated circuit device may include a substrate with a main surface, a compound semiconductor nanowire extending from the main surface in a first direction perpendicular to the main surface and including a lower second section, a first section on the lower second section, and an upper second section on the first section, and a gate electrode on the first section. A portion of the gate electrode may be between, in the first direction, the upper second section and the lower second section. The first section may have a different crystal phase from the upper second section and the lower second section.

BRIEF DESCRIPTION OF THE DRAWINGS

Embodiments of the inventive concepts will be more clearly understood from the following detailed description taken in conjunction with the accompanying drawings in which:

FIGS. 7A to 7C are diagrams of an integrated circuit device according to other embodiments of the inventive concepts, wherein FIG. 7A is a layout of configurations of the integrated circuit device, FIG. 7B is a cross-sectional view taken along line B-B' of FIG. 7A, and FIG. 7C is a cross-sectional view taken along line C-C' of FIG. 7A;

DETAILED DESCRIPTION

Figure 1:
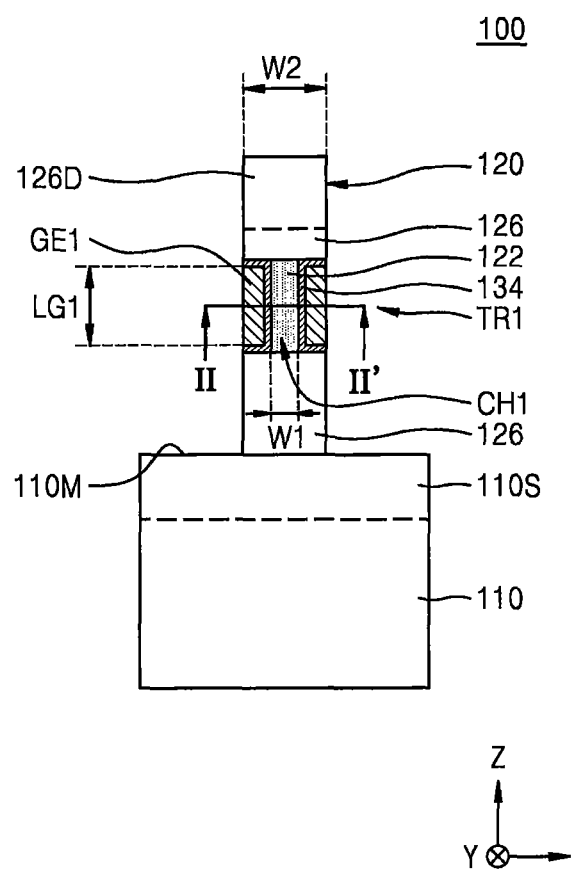
FIG. 1 is a cross-sectional view of configurations of an integrated circuit device according to embodiments of the inventive concepts.

Hereinafter, embodiments will be described in detail with reference to the accompanying drawings. Like reference numerals in the drawings denote like elements throughout, and a repeated description thereof will be omitted.

FIG. 1 is a cross-sectional view of configurations of an integrated circuit device 100 according to embodiments of the inventive concepts.

Referring to FIG. 1, the integrated circuit device 100 may include a substrate 110 having a main surface 110M, and a compound semiconductor nanowire 120 extending from the main surface 110M of the substrate 110 in a first direction (e.g., direction Z) perpendicular to the main surface 110M. The term "nanowire" used herein may refer to a three-dimensional structure having a diameter of about 10 nm or less.

The main surface 110M of the substrate 110 may have a {111} crystal plane.

The compound semiconductor nanowire 120 may have a structure in which a first section 122 and a second section 126 are alternately arranged on the substrate 110 in the first direction (e.g., direction Z). In some embodiments, a pair of second sections 126 may respectively adjoin both ends of the first section 122 with the first section 122 in the middle. The first section 122 and the second section 126 may have the same composition as each other and may have different crystal phases from each other.

The compound semiconductor nanowire 120 may include a Group III-V material. In some embodiments, the compound semiconductor nanowire 120 may include a compound semiconductor that includes at least one of indium (In), gallium (Ga), and aluminum (Al) as a Group III element and at least one of arsenic (As), phosphorus (P), and antimony (Sb) as a Group V element. The first section 122 and the second section 126 may include Group III-V materials having the same composition as each other but may have different crystal phases from each other.

The compound semiconductor nanowire 120 may have a crystal phase superstructure in which a zinc-blende (ZB) crystal phase and a wurtzite (WZ) crystal phase are alternately and regularly arranged. In some embodiments, the first section 122 and the second section 126 may have different crystal phases from each other, and the crystal phases may be selected from the ZB crystal phase and the WZ crystal phase. In some embodiments, the first section 122 may have the WZ crystal phase, and the second section 126 may have the ZB crystal phase. In other embodiments, the first section 122 may have the ZB crystal phase, and the second section 126 may have the WZ crystal phase.

In some embodiments of the inventive concepts, the compound semiconductor nanowire 120 may include, for example, GaAs, GaP, InP, InAs, InSb, GaSb, InGaP, InGaAs, InGaSb, GaAsSb, and/or GaAsP.

Although FIG. 1 illustrates the compound semiconductor nanowire 120 including one first section 122 and a pair of second sections 126 that respectively adjoin both ends of the first section 122 with the first section 122 in the middle, the inventive concepts are not limited thereto. For example, the compound semiconductor nanowire 120 may include a plurality of first sections 122 and a plurality of second sections 126, and the plurality of first sections 122 and the plurality of second sections 126 may be alternately arranged in a length direction of the compound semiconductor nanowire 120 (e.g., direction Z).

In the compound semiconductor nanowire 120, the first section 122 may have a first width W1 in a second direction parallel to the main surface 110M of the substrate 110 (e.g., in direction X). In addition, the second section 126 may have a second width W2 in the second direction, the second width W2 being greater than the first width W1. In some embodiments, the first width W1 may be about 5 to 10 nm, but the inventive concepts are not limited thereto.

A gate electrode GE1 surrounding the first section 122 may be formed in a peripheral region of the first section 122. In the compound semiconductor nanowire 120, a gate dielectric layer 134 may be disposed between the first section 122 and the gate electrode GE1. The first section 122 may provide a vertical channel region CH1 of a transistor TR1 including the gate electrode GE1.

Figure 2A:
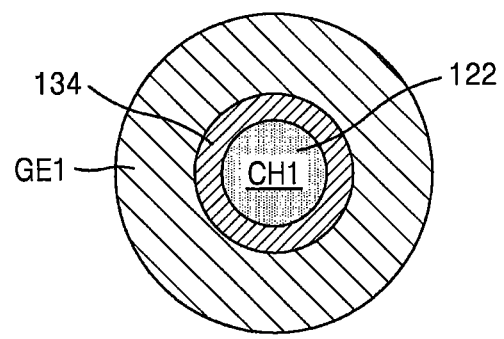
FIGS. 2A to 2C are cross-sectional views of various modified example configurations of an integrated circuit device taken along line II-II' of FIG. 1, according to example embodiments of the inventive concepts.
Figure 2B:
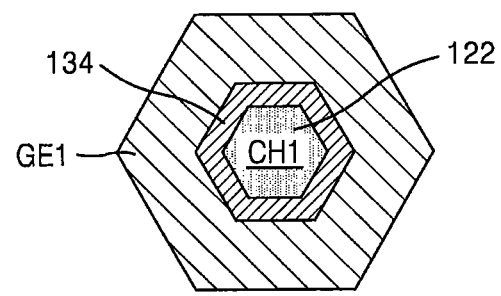
Figure 2C:
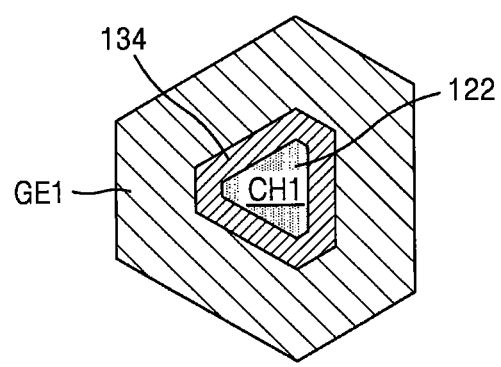

FIGS. 2A to 2C are cross-sectional views of various modified example configurations of an integrated circuit device 100 taken along line II-II' of FIG. 1, according to example embodiments of the inventive concepts.

In some embodiments, as illustrated in FIG. 2A, a cross-section of the first section 122 providing the vertical channel region CH1 of the transistor TR1 in the integrated circuit device 100 may have a circular shape. Accordingly, cross-sections of the gate dielectric layer 134 and the gate electrode GE1 that surround the first section 122 may each have an annular shape, and thus, a transistor that has a gate-all-around (GAA) structure may be provided.

In some embodiments, as illustrated in FIGS. 2B and 2C, a cross-section of the first section 122 providing the vertical channel region CH1 of the transistor TR1 in the integrated circuit device 100 may have various hexagon shapes. Accordingly, the gate dielectric layer 134 and the gate electrode GE1 that surround the first section 122 may each have a hexagon cross-section shape that corresponds to the cross-section shape of the first section 122, and thus, a transistor that has a GAA structure may be provided.

Although FIGS. 2A to 2C illustrate cases in which a cross-section of the first section 122 providing the vertical channel region CH1 has a circular or hexagonal shape, the inventive concepts are not limited thereto. For example, the cross-section of first section 122 may have various polygonal shapes such as, for example, a quadrangle, or may have an oval shape.

Referring to FIG. 1 again, the substrate 110 may include a source region 110S that is formed in the substrate 110 from the main surface 110M. The source region 110S may include an impurity region doped with a first dopant.

A drain region 126D may be formed in at least a portion of a second section 126, from among a plurality of second sections 126 included in the compound semiconductor nanowire 120. In some embodiments, the drain region 126D may be formed in a second section 126, from among the plurality of second sections 126, that is separated from the substrate 110 by at least one first section 122. The drain region 126D may include an impurity region doped with a second dopant.

In some embodiments, each of the source region 110S and the drain region 126D may include an impurity region that has a doping concentration of about $10^{17}$ atom/cm$^3$ or greater, but the inventive concepts are not limited thereto. In some embodiments, the source region 110S and the drain region 126D may be N-type doping regions or P-type doping regions.

The first dopant used for doping the source region 110S and the second dopant used for doping the drain region 126D may be variously selected according to respective composition materials of the substrate 110 and the second section 126. In some embodiments, according to the respective composition materials of the substrate 110 and the second section 126, the first dopant and the second dopant may each be selected from elements that may serve as a donor or an acceptor, for example, Be, Mg, Zn, Cd, C, Si, Ge, Sn, S, Se, and/or Te.

In some embodiments, the first dopant in the source region 110S and the second dopant in the drain region 126D may include different elements from each other. In some embodiments, the first dopant in the source region 110S and the second dopant in the drain region 126D may include the same element as each other.

In some embodiments, the first section 122 providing the vertical channel region CH1 may have a doping type opposite to that in the source region 110S and the drain region 126D. For example, when a doping type of the source region 110S and the drain region 126D is N type, a doping type of the first section 122 may be P type. In some embodiments, when the doping type of the source region 110S and the drain region 126D is P type, the doping type of the first section 122 may be N type. In some embodiments, the first section 122 providing the vertical channel region CH1 may include an undoped material.

The substrate 110 may include a semiconductor such as, for example, silicon (Si) or germanium (Ge), or a compound semiconductor such as, for example, SiGe, SiC, GaAs, InAs, or InP. In some embodiments, the substrate 110 may include at least one of a Group III-V material and a Group IV material. The Group III-V material may be a binary, ternary, or quaternary compound that includes at least one Group III element and at least one Group V element. The Group III-V material may be a compound that includes at least one of In, Ga, and Al as a Group III element and at least one of As, P, and Sb as a Group V element. For example, the Group III-V material may be selected from InP, $In_zGa_{1-z}As$ ($0 \leq z \leq 1$), and $Al_zGa_{1-z}As$ ($0 \leq z \leq 1$). The binary compound may be, for example, one of InP, GaAs, InAs, InSb, and GaSb. The ternary compound may be one of InGaP, InGaAs, AlInAs, InGaSb, GaAsSb, and GaAsP. The Group IV material may be Si or Ge. However, the Group III-V material and the Group IV material that may be used in integrated circuit devices according to one or more embodiments of the inventive concepts are not limited to the above examples.

In some embodiments, the gate dielectric layer 134 may include an interfacial layer that contacts the first section 122 providing the vertical channel region CH1, and a high-k dielectric layer that covers the interfacial layer. The interfacial layer may be obtained by oxidizing a surface of the first section 122. The interfacial layer may include a low-k dielectric material layer that has a dielectric constant of 9 or less, for example, a silicon oxide film, a silicon oxynitride film, a Ga oxide film, a Ge oxide film, or an oxide of a Group III-V material. In some embodiments, the interfacial layer may be omitted. In this case, the gate dielectric layer 134 may include only the high-k dielectric layer.

In some embodiments, the high-k dielectric layer constituting the gate dielectric layer 134 may include a material that has a dielectric constant that is greater than that of the interfacial layer. For example, the high-k dielectric layer may have a dielectric constant of about 10 to 25. The high-k dielectric layer may include a material selected from, for example, hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof. However, a material of the high-k dielectric layer is not limited to the above examples.

The gate electrode GE1 may include a work function controlling metal-containing layer. In some embodiments, the gate electrode GE1 may further include a gap filling metal-containing layer that fills a gap formed in an upper portion of the work function controlling metal-containing layer. In some embodiments, the gate electrode GE1 may include a metal nitride layer and/or a metal layer. The metal nitride layer and/or the metal layer may each include at least one metal selected from, for example, titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). In some embodiments, the gate electrode GE1 may include a stacked structure of TiAlC/TiN, a stacked structure of TiN/TaN/TiAlC/TiN, or a stacked structure of TiN/TaN/TiN/TiAlC/TiN. In the above stacked structures, the TiAlC layer or the TiN layer may serve as the work function controlling metal-containing layer.

Figure 3:
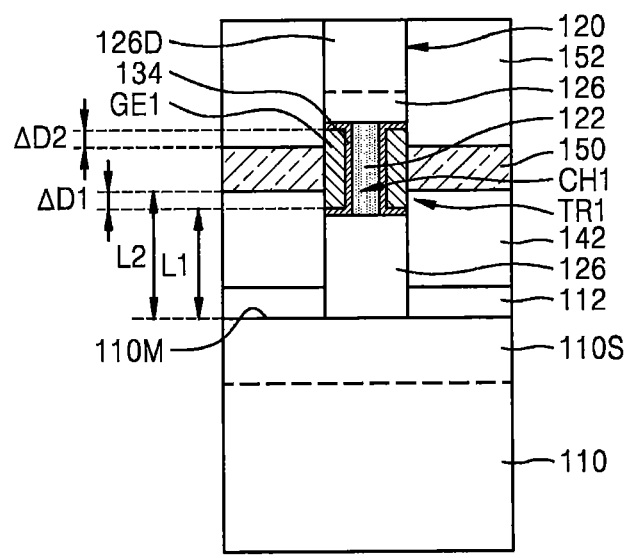
FIG. 3 is a cross-sectional view of configurations of an integrated circuit device according to other embodiments of the inventive concepts.
Figure 3:
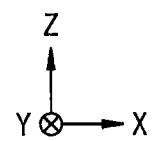

FIG. 3 is a cross-sectional view of configurations of an integrated circuit device 100A according to other embodiments of the inventive concepts.

Referring to FIG. 3, the integrated circuit device 100A generally has the same configuration as those of the integrated circuit device 100 illustrated in FIG. 1. However, the integrated circuit device 100A may further include a wiring layer 150 that contacts the gate electrode GE1 and extends parallel to the main surface 110M of the substrate 110 at substantially the same level as that of the first section 122 on the substrate 110. The wiring layer 150 may serve as a gate contact wiring layer.

In a length direction of the compound semiconductor nanowire 120 (e.g., direction Z), a first shortest distance L1 between the substrate 110 and the gate electrode GE1 may be less than a second shortest distance L2 between the substrate 110 and the wiring layer 150. A distance difference ΔD1 between the first shortest distance L1 and the second shortest distance L2 may be greater than 0. For example, the distance difference ΔD1 may be about 0.1~3 nm, but the inventive concepts are not limited thereto.

In addition, in the length direction of the compound semiconductor nanowire 120 (e.g., direction Z), the uppermost surface of the gate electrode GE1 may be farther from the substrate 110 than the uppermost surface of the wiring layer 150 is. A distance difference ΔD2 between a surface of the gate electrode GE1 that is farthest from the substrate 110 (i.e., an uppermost surface of the gate electrode GE1) and a surface of the wiring layer 150 that is farthest from the substrate 110 (i.e., an uppermost surface of the wiring layer 150) may be greater than 0. For example, the distance difference ΔD2 may be about 0.1~3 nm, but the inventive concepts are not limited thereto.

Each of the distance differences ΔD1 and ΔD2 may have a value greater than 0 so that, in the length direction of the compound semiconductor nanowire 120 (e.g., direction Z), a formation region of the wiring layer 150 may not be out of a vertical length range of the gate electrode GE1 (i.e., the length of the gate electrode GE1 in the Z direction). The distance differences ΔD1 and ΔD2 may provide an alignment margin between the wiring layer 150 and the gate electrode GE1. That is, a process margin for controlling a formation location of the wiring layer 150 during a formation process of the wiring layer 150 may increase by as much as the distance differences ΔD1 and ΔD2.

In some embodiments, the wiring layer 150 may include a metal layer. In some embodiments, the wiring layer 150 may have a stacked structure including a conductive barrier film and a metal layer. The conductive barrier film may include, for example, TiN, TaN, AlN, WN, or a combination thereof. The metal layer may include, for example, W, Cu, Al, an alloy thereof, and/or a combination thereof. However, composition materials of the conductive barrier film and the metal layer are not limited to the above examples.

An insulation mask layer 112 and a lower insulation spacer 142 may be sequentially stacked between the substrate 110 and the wiring layer 150.

The insulation mask layer 112 may cover a portion of a side wall of a second section 126, from among the pair of second sections 126, that is closer to the substrate 110. In some embodiments, the insulation mask layer 112 may include silicon nitride (SiN) and/or dioxide silicon ($SiO_2$), but a material of the insulation mask layer 112 is not limited to the above examples.

The lower insulation spacer 142 may cover a portion of a lower side of the gate electrode GE1, a portion of the gate dielectric layer 134, and a side wall of the second section 126, from among the pair of second sections 126 adjacent the first section 122, that is closer to the substrate 110.

An upper insulation spacer 152 may be on the wiring layer 150. The upper insulation spacer 152 may cover a portion of an upper side of the gate electrode GE1, a portion of the gate dielectric layer 134, and a side wall of a second section 126, from among the pair of second sections 126 adjacent the first section 122, that is farther from the substrate 110.

The wiring layer 150 may include a plate-type conductive layer that extends parallel to the main surface 110M of the substrate 110 between the lower insulation spacer 142 and the upper insulation spacer 152.

In some embodiments, each of the lower insulation spacer 142 and the upper insulation spacer 152 may include a material selected from, for example, SiN, SiCN, SiOCN, $SiO_2$, and a combination thereof, but a material of each of the lower insulation spacer 142 and the upper insulation spacer 152 is not limited to the above examples.

The integrated circuit devices 100 and 100A according to embodiments of the inventive concepts, described with reference to FIGS. 1 to 3, may include the transistor TR1 that uses, as a channel CH1, a compound semiconductor nanowire 120 capable of greatly decreasing a short-channel effect and decreasing power consumption. Accordingly, there may be provided a next-generation integrated circuit device that may exceed, with a fast carrier movement rate, the limit of silicon semiconductors. Also, a gate length LG1 (refer to FIG. 1) that is precisely controlled in a self-alignment manner may be provided using a crystal phase superstructure in which ZB and WZ crystal phases are regularly arranged in the compound semiconductor nanowire 120, and thus, a problem such as performance degradation according to the distribution of gate lengths in the integrated circuit devices 100 and 100A may be circumvented, and high reliability and performance may be realized.

Figure 4:
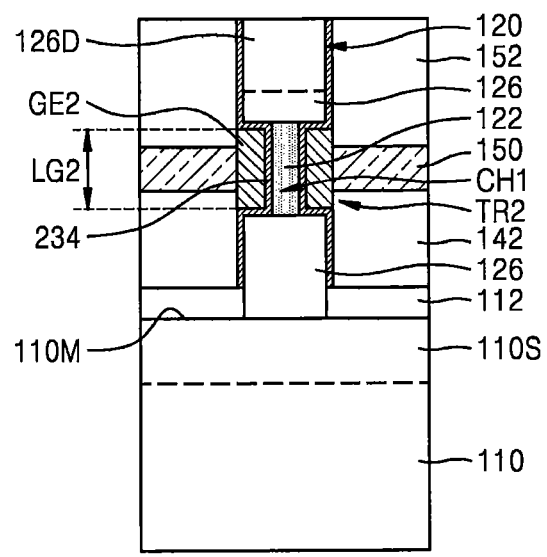
FIG. 4 is a cross-sectional view of configurations of an integrated circuit device according to other embodiments of the inventive concepts.
Figure 4:
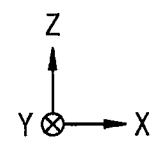

FIG. 4 is a cross-sectional view of configurations of an integrated circuit device 200 according to other embodiments of the inventive concepts. In FIG. 4, elements that are the same or similar as those in FIGS. 1 to 3 are designated by the same reference numerals, and repeated descriptions thereof are omitted.

The integrated circuit device 200 illustrated in FIG. 4 generally has the same configuration as that of the integrated circuit device 100A illustrated in FIG. 3, except that a gate dielectric layer 234 may extend along an external side wall of the compound semiconductor nanowire 120 while covering not only a side wall of the first section 122 but also a side wall of each of the pair of second sections 126 respectively connected to both ends of the first section 122, and an external side wall of a gate electrode GE2 may extend aligned with an external side wall of a portion of the gate dielectric layer 234 that covers the side wall of the second section 126.

Detailed configurations of the gate dielectric layer 234 and the gate electrode GE2 are the same as described above regarding the gate dielectric layer 134 and the gate electrode GE1 with reference to FIGS. 1 to 3.

The integrated circuit device 200 according to embodiments, described with reference to FIG. 4, may include a transistor TR2 that uses, as a channel CH1, a compound semiconductor nanowire 120 capable of greatly decreasing a short-channel effect and decreasing power consumption. Accordingly, there may be provided a next-generation integrated circuit device that may exceed, with a fast carrier movement rate, the limit of silicon semiconductors. Also, a gate length LG2 that is precisely controlled in a self-alignment manner may be provided using a crystal phase superstructure in which ZB and WZ crystal phases are regularly arranged in the compound semiconductor nanowire 120. Also, as the gate dielectric layer 234 extends along an external wall of the compound semiconductor nanowire 120 while covering from a side wall of the first section 122 to a side wall of each of the pair of second sections 126 connected to both ends of the first section 122, the gate dielectric layer 234 may serve as a barrier film between the wiring layer 150 and the compound semiconductor nanowire 120. Accordingly, an undesired reaction between the wiring layer 150, or a material thereof, and the compound semiconductor nanowire 120 may be reduced or prevented from taking place while the wiring layer 150 is formed, and the integration density of the integrated circuit device 200 may be improved.

Figure 5:
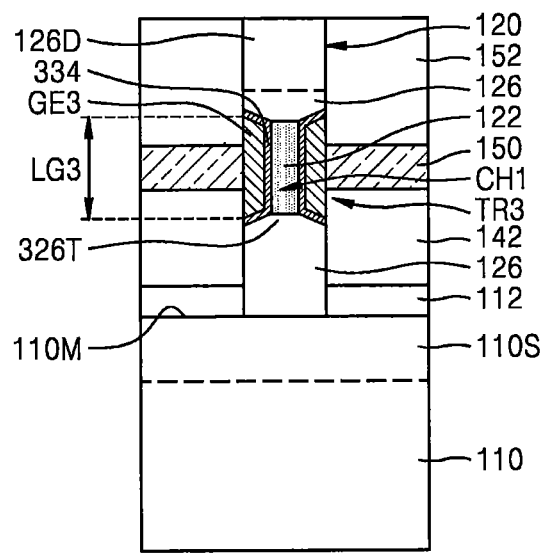
FIG. 5 is a cross-sectional view of configurations of an integrated circuit device according to other embodiments of the inventive concepts.
Figure 5:
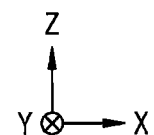

FIG. 5 is a cross-sectional view of configurations of an integrated circuit device 300 according to other embodiments of the inventive concepts. In FIG. 5, elements that are the same or similar as those in FIGS. 1 to 3 are designated by the same reference numerals, and repeated descriptions thereof are omitted.

The integrated circuit device 300 illustrated in FIG. 5 generally has the same configuration as that of the integrated circuit device 100A illustrated in FIG. 3. However, in the integrated circuit device 300, the pair of second sections 126 respectively adjoining both ends of the first section 122 may have a truncated shape portion 326T having a decreasing width so as to have a decreasing cross-section area toward the first section 122 in an end portion of the respective ones of the pair of second sections 126 that adjoins the first section 122. The truncated shape portion 326T may have various shapes such as a truncated circular cone or a truncated hexagonal pyramid.

Also, in the integrated circuit device 300, a gate dielectric layer 334 may extend covering not only a side wall of the first section 122 but also a side wall of the truncated shape portion 326T of the respective ones of the pair of second sections 126, and a gate electrode GE3 may fill a surrounding space of the first section 122 between the pair of second sections 126. In some embodiments, the gate electrode GE3 may fill a space limited by the gate dielectric layer 334.

Detailed configuration of the gate dielectric layer 334 and the gate electrode GE3 are the same or similar as described above regarding the gate dielectric layer 134 and the gate electrode GE1 with reference to FIGS. 1 to 3.

The integrated circuit device 300 according to embodiments of the inventive concepts, described with reference to FIG. 5, may include a transistor TR3 that uses, as a channel CH1, a compound semiconductor nanowire 120 capable of greatly decreasing a short-channel effect and decreasing power consumption. Accordingly, there may be provided a next-generation integrated circuit device that may exceed, with a fast carrier movement rate, the limit of silicon semiconductors. Also, a gate length LG3 that is precisely controlled in a self-alignment manner may be provided using a crystal phase superstructure in which ZB and WZ crystal phases are regularly arranged in the compound semiconductor nanowire 120. Further, an increased gate length LG3 may be provided using the truncated shape portion 326T included in respective ones of the pair of second sections 126, and thus, performance of the transistor TR3 may be improved. Also, as the gate length LG3 increases, an alignment margin between the wiring layer 150 and the gate electrode GE3 may increase.

Figure 6:
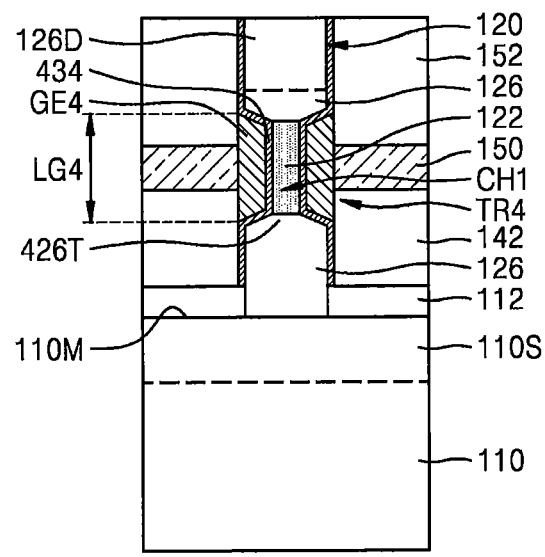
FIG. 6 is a cross-sectional view of configurations of an integrated circuit device according to other embodiments of the inventive concepts.
Figure 6:
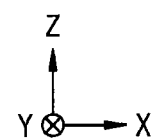

FIG. 6 is a cross-sectional view of configurations of an integrated circuit device 400 according to other embodiments of the inventive concepts. In FIG. 6, elements that are the same or similar as those in FIGS. 1 to 5 are designated by the same reference numerals, and repeated descriptions thereof are omitted.

The integrated circuit device 400 illustrated in FIG. 6 generally has the same or similar configuration as that of the integrated circuit device 200 illustrated in FIG. 4. However, in the integrated circuit device 400, the pair of second sections 126 respectively adjoining both ends of the first section 122 may have a truncated shape portion 426T having a decreasing width so as to have a decreasing cross-section area toward the first section 122 in an end portion of the respective ones of the pair of second sections 126 that adjoins the first section 122. The truncated shape portion 426T may have various shapes such as a truncated circular cone or a truncated hexagonal pyramid.

Also, in the integrated circuit device 400, a gate dielectric layer 434 may extend along an external wall of the compound semiconductor nanowire 120 while covering not only a side wall of the first section 122 but also a side wall of each of the pair of second sections 126 respectively connected to both ends of the first section 122, and a gate electrode GE4 may include a portion surrounding the first section 122 and a portion surrounding the truncated shape portion 426T. In addition, an external side wall of the gate electrode GE4 may extend aligned with an external side wall of a portion of the gate dielectric layer 434 that covers the side wall of the second section 126.

Detailed configurations of the gate dielectric layer 434 and the gate electrode GE4 are the same or similar as described above regarding the gate dielectric layer 134 and the gate electrode GE1 with reference to FIGS. 1 to 3.

The integrated circuit device 400 according to embodiments, described with reference to FIG. 6, includes a transistor TR4 that uses, as a channel CH1, a compound semiconductor nanowire 120 capable of greatly decreasing a short-channel effect and decreasing power consumption. Accordingly, there may be provided a next-generation integrated circuit device that may exceed, with a fast carrier movement rate, the limit of silicon semiconductors. Also, a gate length LG4 that is precisely controlled in a self-alignment manner may be provided using a crystal phase superstructure in which ZB and WZ crystal phases are regularly arranged in the compound semiconductor nanowire. Also, an increased gate length LG4 may be provided using the truncated shape portion 426T included in the respective ones of the pair of second sections 126, and thus, performance of the transistor TR4 may be improved. Also, as the gate length LG4 increases, an alignment margin between the wiring layer 150 and the gate electrode GE4 may increase. In addition, as the gate dielectric layer 434 extends on the compound semiconductor nanowire 120 while covering from a side wall of the first section 122 to a side wall of each of the pair of second sections 126 connected to both ends of the first section 122, the gate dielectric layer 434 may serve as a barrier film between the wiring layer 150 and the compound semiconductor nanowire 120. Accordingly, an undesired reaction between the wiring layer 150 or a material thereof and the compound semiconductor nanowire 120 may be reduced or prevented from taking place while the wiring layer 150 is formed, and the integration density of the integrated circuit device 400 may be improved.

Figure 7A:
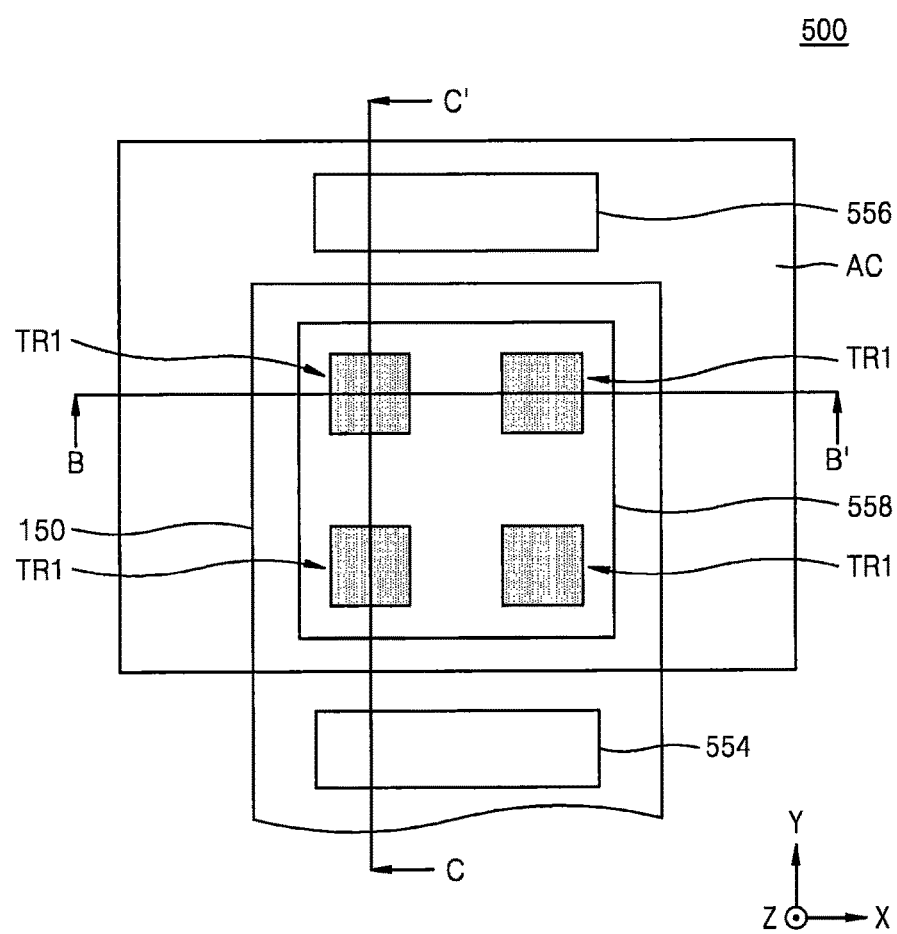
Figure 7B:
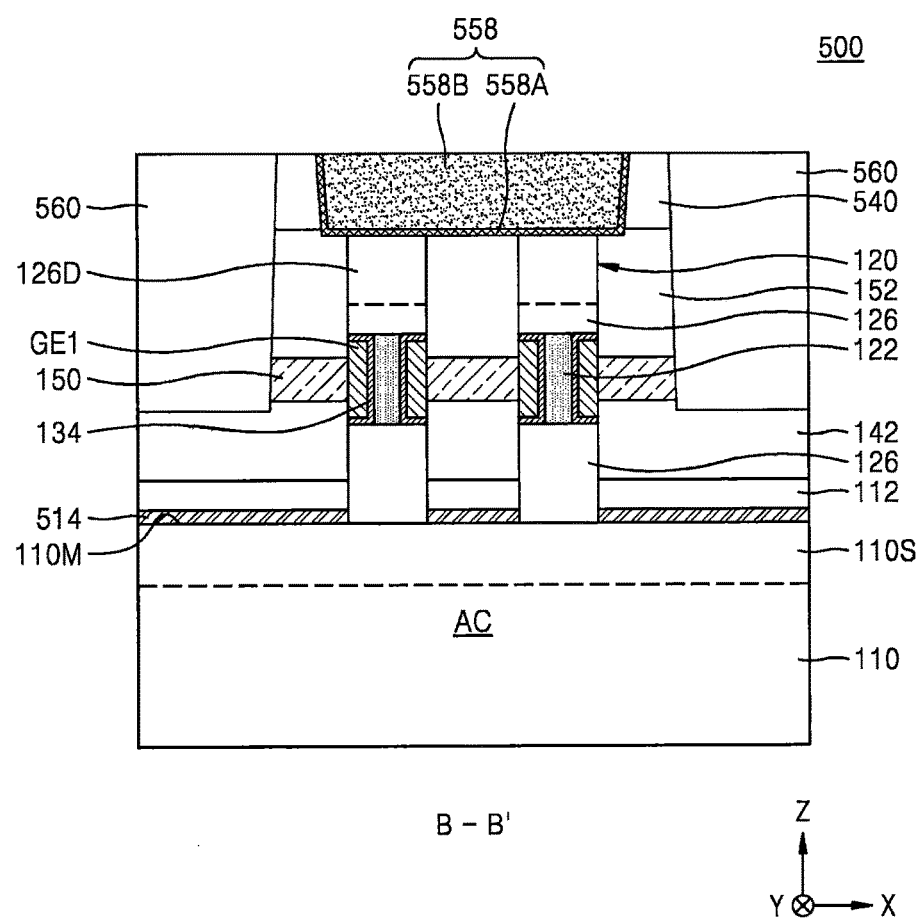
Figure 7C:
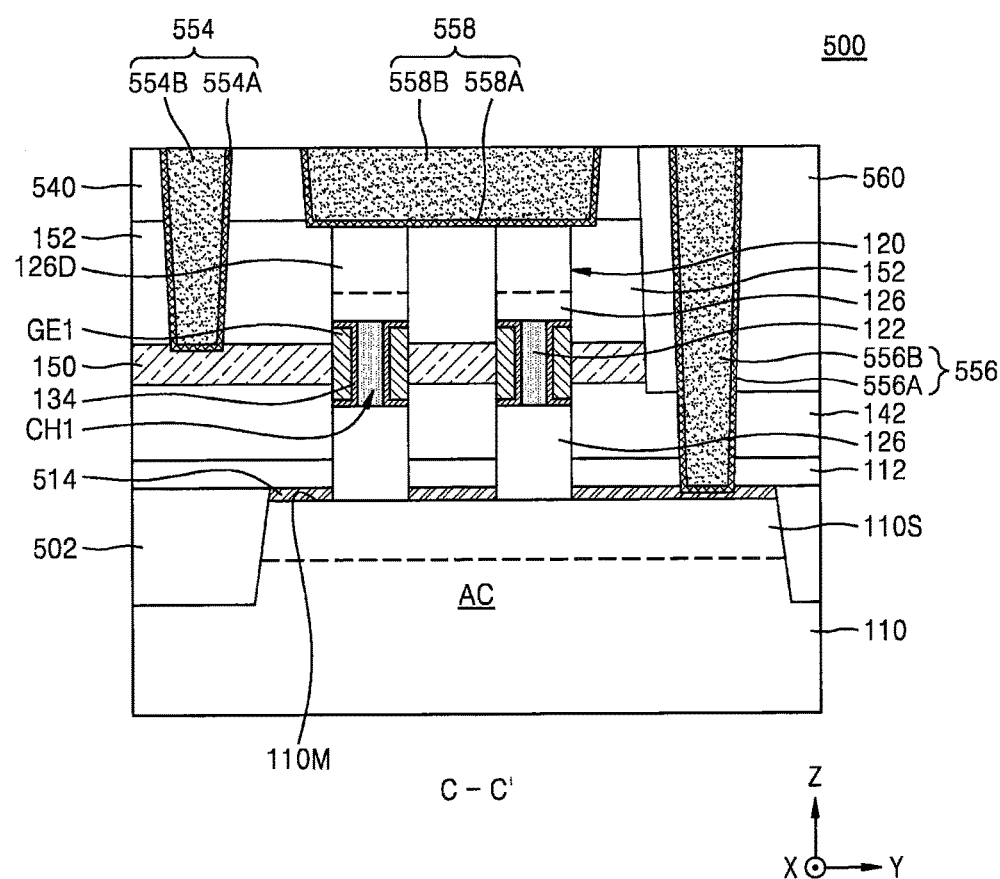

FIGS. 7A to 7C are diagrams of an integrated circuit device 500 according to other embodiments of the inventive concepts, wherein FIG. 7A is a layout of configurations of the integrated circuit device 500, FIG. 7B is a cross-sectional view taken along line B-B' of FIG. 7A, and FIG. 7C is a cross-sectional view taken along line C-C' of FIG. 7A. In FIGS. 7A to 7C, elements that are the same or similar as those in FIGS. 1 to 3 are designated by the same reference numerals, and repeated descriptions thereof are omitted.

Referring to FIGS. 7A to 7C, the integrated circuit device 500 may include the substrate 110 having an active region AC defined by a device isolation film 502. The source region 110S is formed in the active region AC, and a surface of the source region 110S is covered with a metal silicide film 514. In some embodiments, the metal silicide film 514 may include at least one metal selected from, for example, Ti, W, Ru, Nb, Mo, Hf, Ni, Co, Pt, Yb, Tb, Dy, Er, Pd, and a combination thereof.

On the active region AC of the substrate 110, a plurality of compound semiconductor nanowires 120 may protrude in a first direction (e.g., direction Z). Although FIG. 7A illustrates a case in which four compound semiconductor nanowires 120 (illustrated as TR1) are formed on one active region AC, the inventive concepts are not limited to the illustration in the accompanying drawing.

The gate dielectric layer 134 and the gate electrode GE1 that surround the first section 122 may be formed around the first section 122 of each of the plurality of compound semiconductor nanowires 120.

The wiring layer 150 may extend parallel to the main surface 110M of the substrate 110 at the same level as that of the first section 122 of each of the plurality of compound semiconductor nanowires 120. A plurality of gate electrodes GE1 surrounding first sections 122 of the plurality of compound semiconductor nanowires 120 above the active region AC may be connected to one wiring layer 150.

A first conductive contact plug 554 may be connected to the wiring layer 150. The first conductive contact plug 554 may include a first conductive barrier film 554A and a first conductive plug 554B. The first conductive contact plug 554 may be used as a gate contact.

The first conductive barrier film 554A may include, for example, TiN, TaN, AlN, WN, or a combination thereof, and the first conductive plug 554B may include, for example, W, Cu, Al, an alloy thereof, and/or a combination thereof. However, the inventive concepts are not limited to the example materials.

A second conductive contact plug 556 may be connected to the source region 110S. The second conductive contact plug 556 may include a second conductive barrier film 556A and a second conductive plug 556B. The second conductive contact plug 556 may be used as a source contact. The second conductive barrier film 556A may include, for example, TiN, TaN, AlN, WN, or a combination thereof, and the second conductive plug 556B may include, for example, W, Cu, Al, an alloy thereof, and/or a combination thereof. However, the inventive concepts are not limited to the example materials.

Each of the first conductive contact plug 554 and the second conductive contact plug 556 may extend parallel to the plurality of compound semiconductor nanowires 120 in the first direction (e.g., direction Z).

The drain region 126D formed in the second section 126 of each of the plurality of compound semiconductor nanowires 120 may be connected to a top contact conductive layer 558. A plurality of drain regions 126D of a plurality of transistors TR1 formed on the one active region AC may be connected to one top contact conductive layer 558. The top contact conductive layer 558 may be used as a drain contact. The top contact conductive layer 558 may include a top barrier film 558A and a top conductive film 558B. The top barrier film 558A may include, for example, TiN, TaN, AlN, WN, or a combination thereof, and the top conductive film 558B may include, for example, W, Cu, Al, an alloy thereof, and/or a combination thereof. However, the inventive concepts are not limited to the example materials.

The top contact conductive layer 558 may penetrate an upper insulation layer 540 covering the upper insulation spacer 152.

A horizontal width of the wiring layer 150, a horizontal width of the upper insulation spacer 152, and a horizontal width of the upper insulation layer 540 may each be limited by a buried insulation layer 560. As used herein, a horizontal width may be a width of a given element in a direction parallel to the substrate 110.

The first conductive contact plug 554 may extend in the first direction (e.g., direction Z) from the wiring layer 150, while penetrating the upper insulation spacer 152 and the upper insulation layer 540. The second conductive contact plug 556 may extend in the first direction (e.g., direction Z), while penetrating the insulation mask layer 112, the lower insulation spacer 142, and the buried insulation layer 560, from the metal silicide film 514 formed on the surface of the source region 110S.

Each of the upper insulation layer 540 and the buried insulation layer 560 may include an oxide film, a nitride film, or a combination thereof, but a material of each of the upper insulation layer 540 and the buried insulation layer 560 is not limited thereto.

Next, methods of manufacturing integrated circuit devices according to embodiments will be described in detail.

FIGS. 8A to 8I are cross-sectional views illustrating methods of manufacturing integrated circuit devices according to embodiments of the inventive concepts. An example manufacturing method of the integrated circuit device 100A illustrated in FIG. 3 will be described with reference to FIGS. 8A to 8I. In FIGS. 8A to 8I, elements that are the same or similar as those in FIGS. 1 to 3 are designated by the same reference numerals, and repeated descriptions thereof are omitted.

Figure 8A:
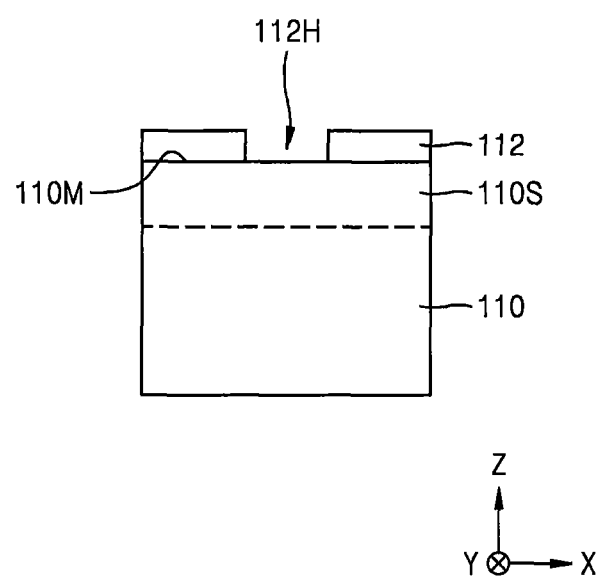
FIGS. 8A to 8I are cross-sectional views illustrating methods of manufacturing integrated circuit devices according to embodiments of the inventive concepts.

Referring to FIG. 8A, the substrate 110 having the main surface 110M that is a {111} crystal plane is prepared, and the source region 110S is formed by injecting a first dopant into the substrate 110 from the main surface 110M of the substrate 110.

The first dopant may be variously selected according to a composition material of the substrate 110. Detailed configuration of the first dopant may be understood from the descriptions made with reference to FIG. 1.

Afterwards, the insulation mask layer 112 having a hole 112H that exposes the main surface 110M may be formed on the substrate 110.

Figure 8B:
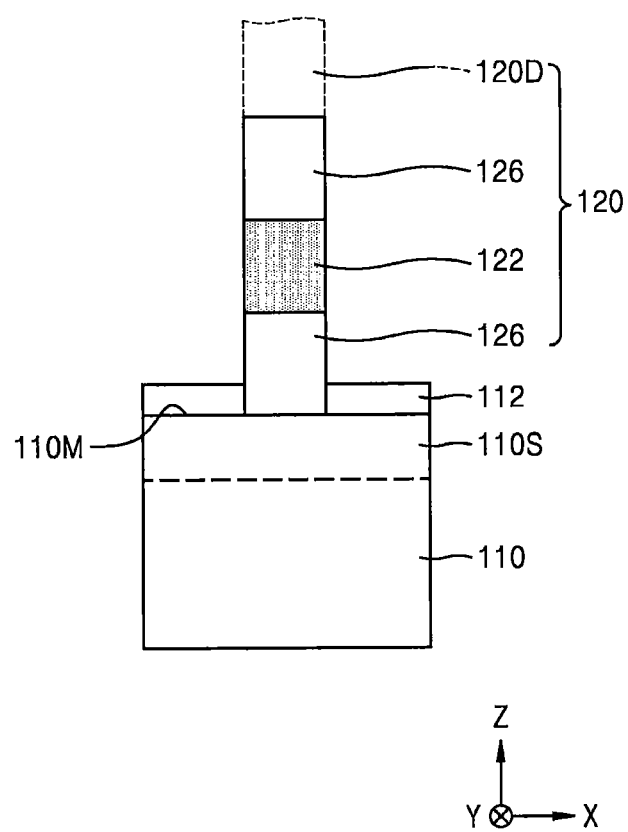

Referring to FIG. 8B, the compound semiconductor nanowire 120 including a Group III-V material may be grown from the main surface 110M of the substrate 110 that is exposed via the hole 112H.

The compound semiconductor nanowire 120 may be formed such that the first section 122 and the second section 126 having the same composition as each other, but different crystal phases from each other, are alternately arranged in a first direction (e.g., direction Z). The first section 122 and the second section 126 may have different crystal phases from each other, such as, for example, crystal phases selected from a ZB crystal phase and a WZ crystal phase. In some embodiments, the first section 122 may have the WZ crystal phase, and the second section 126 may have the ZB crystal phase. In some embodiments, the first section 122 may have the ZB crystal phase, and the second section 126 may have the WZ crystal phase. A length of each of the first section 122 and the second section 126 in the first direction (e.g., direction Z) may be variously selected as necessary.

FIG. 8B illustrates a case in which the compound semiconductor nanowire 120 includes one first section 122 above the substrate 110 and the pair of second sections 126 respectively adjoining both ends of the one first section 122 with the first section 122 in the middle. However, as marked with a dashed line in FIG. 8B, the compound semiconductor nanowire 120 may further include a dummy section 120D on the second section 126 covering the first section 122. In some embodiments, the dummy section 120D may include a material that has the same composition and the same crystal phase as those of the first section 122. In some embodiments, the dummy section 120D may include a material that has the same composition and the same crystal phase as those of the second section 126.

In some embodiments, an epitaxial growth process may be used to grow the compound semiconductor nanowire 120. The epitaxial growth process may include, for example, molecular beam epitaxy (MBE), metal-organic vapor phase epitaxy (MOVPE), metal-organic chemical vapor deposition (MOCVD), rapid thermal chemical vapor deposition (RTCVD), low-energy plasma deposition (LEPD), ultra-high vacuum chemical vapor deposition (UHVCVD), or atmospheric pressure chemical vapor deposition (APCVD).

In some embodiments, process temperature, reaction gas, chamber pressure, etc. during the epitaxial growth process may be controlled to differently control crystal phases of the first section 122 and the second section 126 constituting the compound semiconductor nanowire 120.

When the crystal phases of the first section 122 and the second section 126 of the compound semiconductor nanowire 120 are differently controlled using the process temperature during the epitaxial growth process, the first section 122 and the second section 126 may be grown with the process temperature during epitaxial growth under different temperature conditions from each other. In some embodiments, the temperature conditions may be selected from a range of about 400~480° C. In some embodiments, when a temperature condition is selected from a relatively low temperature range within the range of about 400~480° C. (e.g., a range of about 400~420° C.), an InAs, InP, and/or GaAs nanowire section that has the WZ crystal phase may be formed. In addition, when a temperature condition is selected from a relatively high temperature range within the range of about 400~480° C. (e.g., a range of about 450~480° C.) an InAs, InP, or GaAs nanowire section that has the ZB crystal phase may be formed. The above temperature ranges are just examples, and various changes and modifications may be made therein within the scope of the inventive concepts. For example, the process temperature during epitaxial growth may be variously selected from a range of about 300~550° C. As described above, nanowire sections having desired crystal phases may be formed to have a precisely controlled length by properly changing the process temperature during the epitaxial growth process as desired.

The crystal phases of the first section 122 and the second section 126 of the compound semiconductor nanowire 120 may be differently controlled using process gas and pressure during the epitaxial growth process. In this case, the ZB crystal phase may be derived by further adding Zn, in addition to source gases of a compound to be formed by epitaxial growth, and properly controlling pressure. For example, while the compound semiconductor nanowire 120 including InP or GaP is grown into the WZ crystal phase, the WZ crystal phase may be transitioned into the ZB crystal phrase by supplying a sufficient amount of Zn together with source gases for InP growth under a pressure of about $4.6 \times 10^{-5}$ mbar. In this case, a section, from among the first section 122 and the second section 126 of the compound semiconductor nanowire 120, that has the ZB crystal phase may have a structure doped with Zn. The above pressure is just an example, and the inventive concepts are not limited thereto. For example, various pressure ranges selected from a range of about $1 \times 10^{-2} \sim 1 \times 10^{-7}$ mbar may be applied as necessary to differently control the crystal phases of the first section 122 and the second section 126 of the compound semiconductor nanowire 120.

In another example of differently controlling the crystal phases of the first section 122 and the second section 126 of the compound semiconductor nanowire 120 by using the process gas during the epitaxial growth process, supply maintenance and supply cut-off of one of the process gases that are used during the epitaxial growth process may be selectively controlled. For example, while the compound semiconductor nanowire 120 including a Group III-V material is grown, supply maintenance and supply cut-off of a source gas of a Group III element may be repeatedly performed. While supply of the source gas of the Group III element is cut-off during the process of growing the compound semiconductor nanowire 120, stacking faults of a relatively high density may be formed in a direction perpendicular to a <111> growth direction. By regularly forming such stacking faults, the compound semiconductor nanowire 120 having a crystal phase superstructure in which ZB and WZ crystal phases are regularly arranged may be obtained. For example, in forming the compound semiconductor nanowire 120 including InAs, a low-pressure MOVPE (LP-MOVPE) process may be performed using the MOVPE system. In this regard, while an InAs nanowire having the ZB crystal phase is grown using trimethyl indium (TMI) as a source gas of the Group III element and using arsine ($AsH_3$) as a source gas of a Group V element under a process temperature of about 420~460° C., supply of TMI may be cut-off at a desired point of time, and the process temperature may be lowered to about 380° C. to grow an InAs nanowire having the WZ crystal phase. As described above, nanowire sections having desired crystal phases may be formed to have a precisely controlled length by properly changing an on-time and an off-time of source gas supply of the Group III element as desired.

Figure 8C:
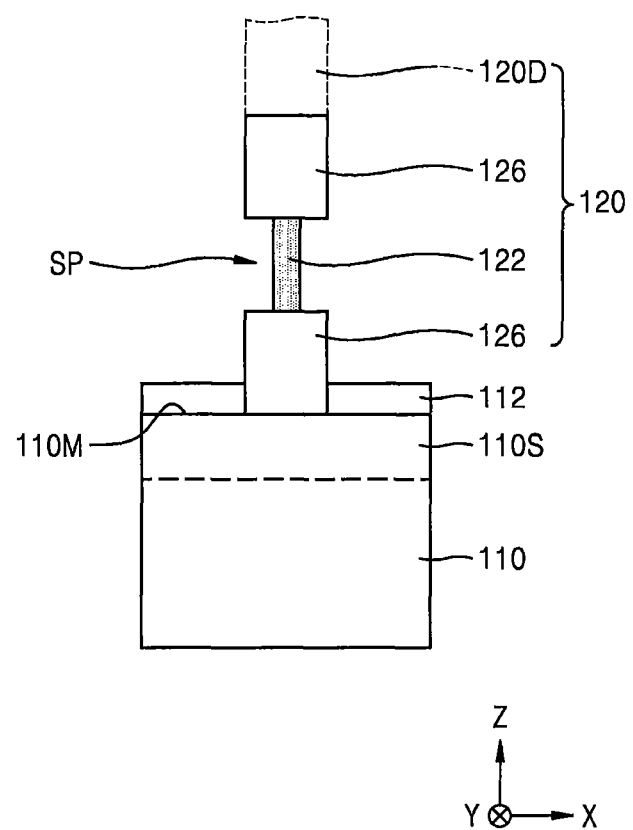

Referring to FIG. 8C, a width of the first section 122 may be decreased by selectively etching only the first section 122 from among the first section 122 and the second sections 126 in the compound semiconductor nanowire 120, and at the same time, a space SP having a vertical length limited by the pair of second sections 126 on both sides of the first section 122 having the decreased width may be prepared.

A difference in etch rates according to crystal phases may be used to selectively etch only the first section 122 from among the first section 122 and the second sections 126. For example, etching using Piranha solution, galvanic etching, or alkaline etching using ammonium polysulfide may be used to selectively etch only the first section 122 from among the first section 122 and the second sections 126. However, the inventive concepts are not limited to the above examples.

When the dummy section 120D has the same crystal phase as that of the first section 122, a width of the dummy section 120D may also decrease together with a width of the first section 122 while the first section 122 is selectively etched. Although only the one first section 122 included in the compound semiconductor nanowire 120 is illustrated and described in the present example, the inventive concepts are not limited to the illustrations in the accompanying drawings.

Figure 8D:
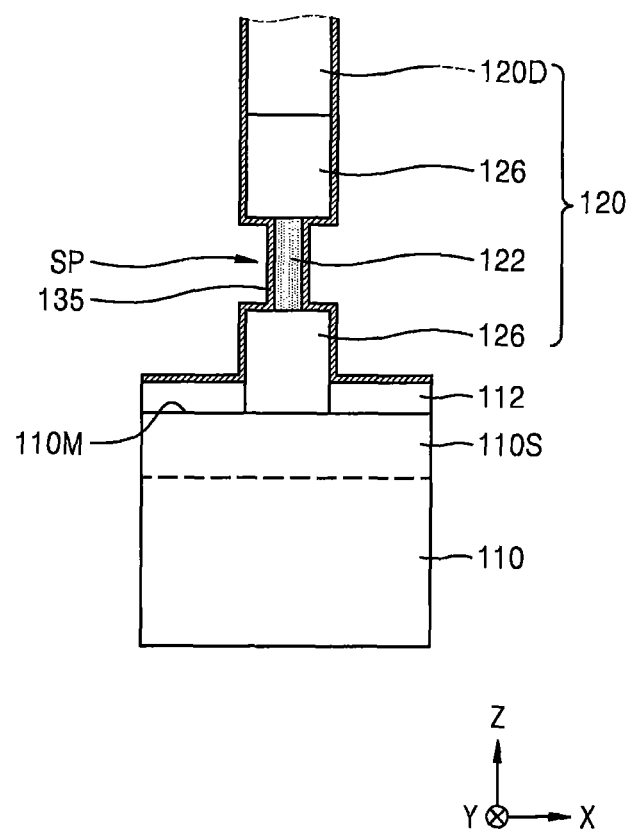

Referring to FIG. 8D, a gate dielectric layer 135 covering an exposed surface of the entire compound semiconductor nanowire 120 that includes a surface of the first section 122 having the decreased width (i.e., the surface exposed via the space SP) is formed.

The gate dielectric layer 135 may include an interfacial layer contacting the first section 122, and a high-k dielectric layer covering the interfacial layer. The interfacial layer may be obtained by oxidizing the surface of the first section 122. The high-k dielectric layer may be formed by an atomic layer deposition (ALD) or chemical vapor deposition (CVD) process. The gate dielectric layer 134 may be formed to cover the exposed surface of the compound semiconductor nanowire 120 in a uniform thickness.

Figure 8E:
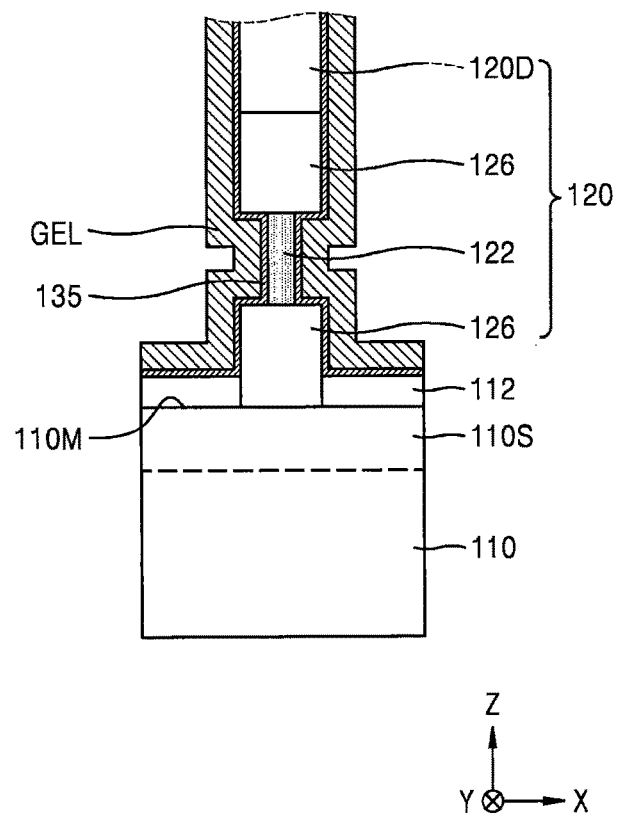

Referring to FIG. 8E, a gate electrode forming conductive layer GEL is formed on the gate dielectric layer 135 to fill the space SP (refer to FIG. 8D) around the first section 122 having the decreased width.

The conductive layer GEL may include a work function controlling metal-containing layer. In some embodiments, the conductive layer GEL may include a metal nitride layer or a metal layer. Each of the metal nitride layer and the metal layer may include at least one metal selected from, for example, Ti, W, Ru, Nb, Mo, Hf, Ni, Co, Pt, Yb, Tb, Dy, Er, and Pd. Each of the metal nitride layer and the metal layer may be formed by an ALD, metal organic ALD (MOALD), or MOCVD process. In some embodiments, the conductive layer GEL may include a stacked structure of TiAlC/TiN, a stacked structure of TiN/TaN/TiAlC/TiN, or a stacked structure of TiN/TaN/TiN/TiAlC/TiN.

Figure 8F:
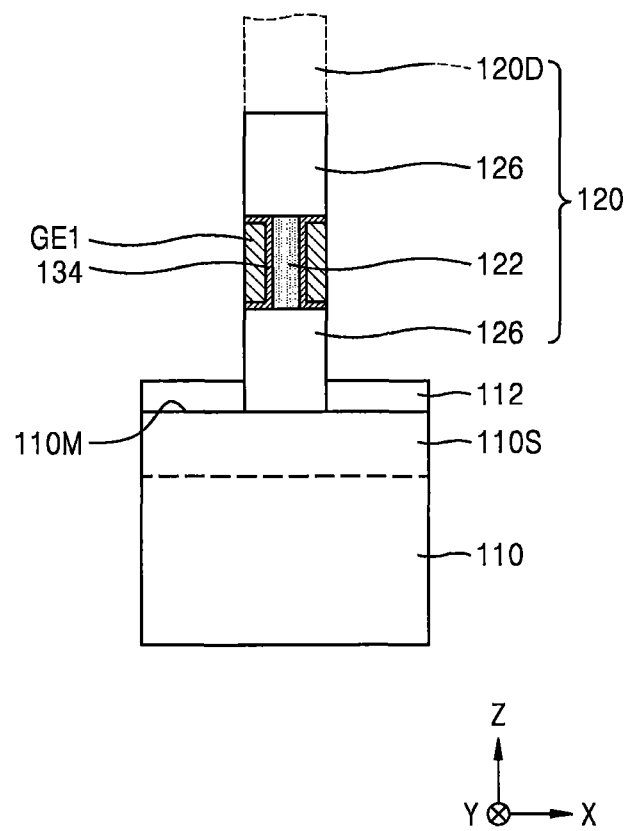

Referring to FIG. 8F, by performing anisotropic dry etching on the conductive layer GEL and the gate dielectric layer 135 in a self-alignment manner using a shape of the compound semiconductor nanowire 120, portions of the conductive layer GEL and the gate dielectric layer 135 that are at the outside of the space SP (refer to FIG. 8D) around the first section 122 having the decreased width are removed to expose the top surface of the insulation mask layer 112 and side walls of the plurality of second sections 126. As a result, the gate electrode GE1 covering the gate dielectric layer 134 in the space SP may be obtained.

Figure 8G:
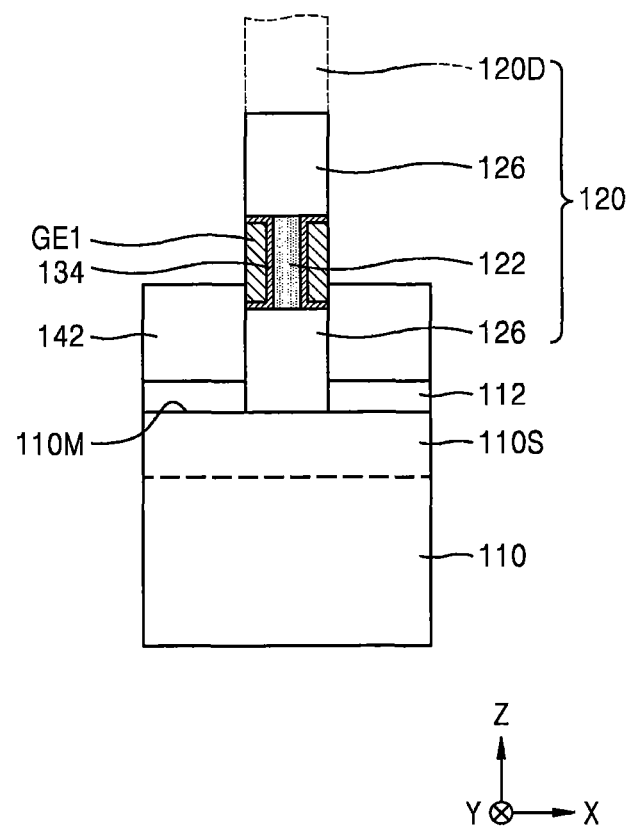

Referring to FIG. 8G, the lower insulation spacer 142 covering a side wall of the second section 126 (from among the pair of second sections 126 on both sides of the first section 122 surrounded by the gate electrode GE1 around the compound semiconductor nanowire 120) that is closer to the substrate 110, and covering a lower side portion of an external side wall of the gate electrode GE1, may be formed.

In some embodiments, in order to form the lower insulation spacer 142, a first insulation layer covering the insulation mask layer 112 and the compound semiconductor nanowire 120 may be formed, and, subsequently, a portion of the first insulation layer may be etched back so that the lower insulation spacer 142 illustrated in FIG. 8G may be left on the insulation mask layer 112.

The lower insulation spacer 142 may include a material selected from, for example, SiN, SiCN, SiOCN, $SiO_2$, and a combination thereof, but a material of the lower insulation spacer 142 is not limited to the above examples.

Figure 8H:
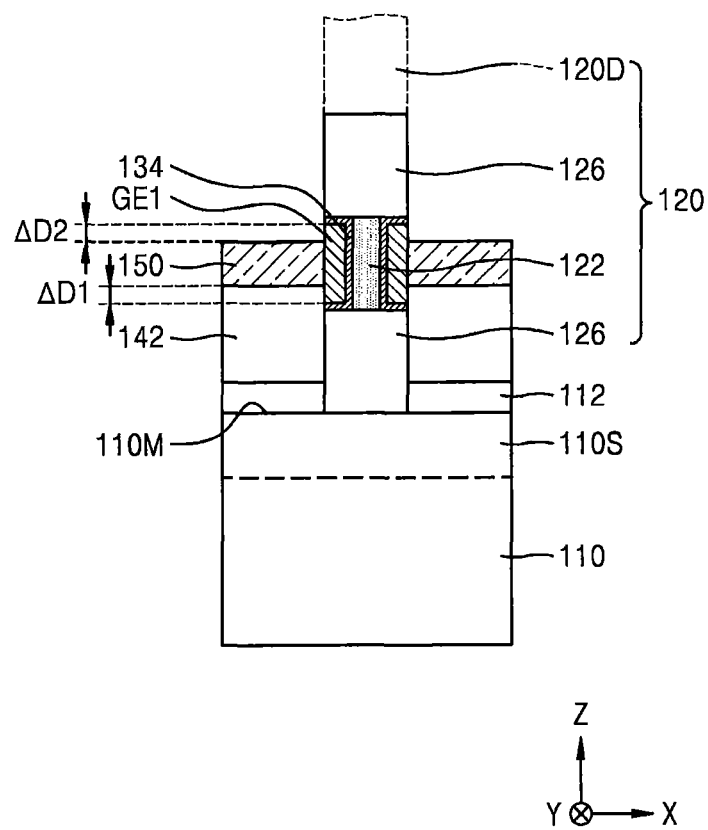

Referring to FIG. 8H, the wiring layer 150 covering, on the lower insulation spacer 142, a middle portion of the external side wall of the gate electrode GE1 may be formed.

The wiring layer 150 may be connected to the gate electrode GE1 and may serve as a gate contact wiring layer. In forming the wiring layer 150, a thickness of the wiring layer 150 may be determined such that each of the distance difference ΔD1 between a lowermost portion of the gate electrode GE1 and a lowermost portion of the wiring layer 150 and the distance difference ΔD2 between an uppermost portion of the gate electrode GE1 and an uppermost portion of the wiring layer 150, in a length direction of the compound semiconductor nanowire 120 (e.g., direction Z), may be greater than 0.

In order to form the wiring layer 150, a wiring forming conductive layer covering the lower insulation spacer 142 and the compound semiconductor nanowire 120 may be formed. In some embodiments, the wiring forming conductive layer may include a metal layer. In some embodiments, the wiring forming conductive layer may have a stacked structure including a conductive barrier film and a metal layer. The conductive barrier film may include, for example, TiN, TaN, AlN, WN, or a combination thereof. The metal layer may include, for example, W, Cu, Al, an alloy thereof, and/or a combination thereof. However, composition materials of the conductive barrier film and the metal layer are not limited to the above examples. After the wiring forming conductive layer is formed, a portion of the wiring forming conductive layer may be removed by etch-back so that the wiring layer 150 illustrated in FIG. 8H may be left. While the portion of the wiring forming conductive layer is etched back, an alignment margin between the wiring layer 150 and the gate electrode GE1 may be further obtained at least as much as the distance difference ΔD2. Accordingly, during a process of forming the wiring layer 150, the thickness of the wiring layer 150 may be controlled in a state where a relatively big process margin is obtained, and thus, alignment precision for connection between the wiring layer 150 and the gate electrode GE1 may be more easily obtained even without applying an overly strict process condition.

Figure 8I:
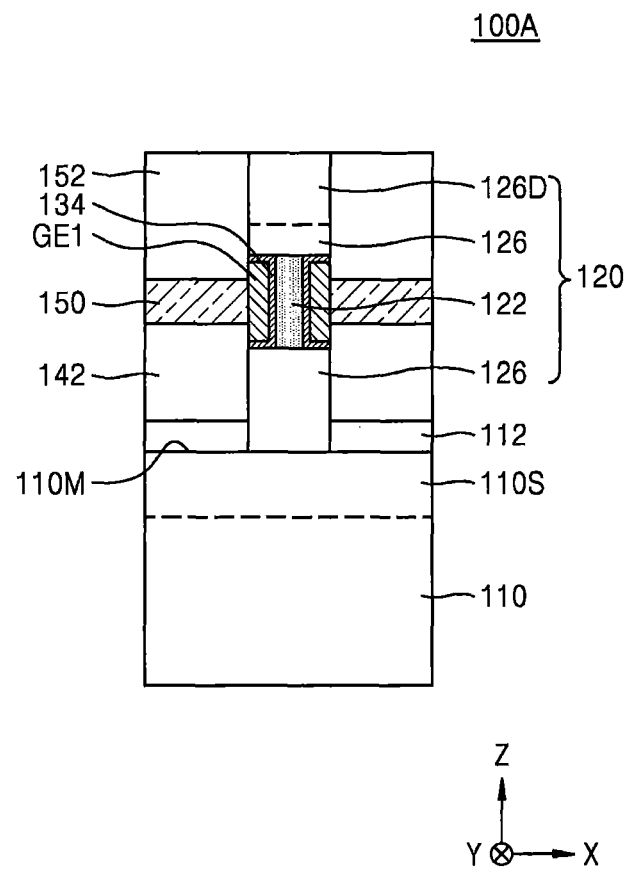

Referring to FIG. 8I, the upper insulation spacer 152 covering the wiring layer 150, an upper side portion of the external side wall of the gate electrode GE1, and a side wall of the second section 126 that is farther from the substrate 110 (from among the pair of second sections 126 on both sides of the first section 122 of the compound semiconductor nanowire 120) may be formed.

In some embodiments, in order to form the upper insulation spacer 152, a second insulation layer covering the wiring layer 150 and the compound semiconductor nanowire 120 may be formed, and, subsequently, a planarization process may be performed on the second insulation layer and the compound semiconductor nanowire 120 until the second section 126, from among the pair of second sections 126, that is farther from the substrate 110 is exposed. As a result, top surfaces of the upper insulation spacer 152, which is a remaining portion of the second insulation layer, and the compound semiconductor nanowire 120 may extend on the same plane.

The upper insulation spacer 152 may include a material selected from, for example, SiN, SiCN, SiOCN, $SiO_2$, and a combination thereof, but a material of the upper insulation spacer 152 is not limited to the above examples.

Afterwards, the drain region 126D is formed by implanting a second dopant into the second section 126 that is exposed at the top surface of the compound semiconductor nanowire 120.

The second dopant may be variously selected according to a composition material of the compound semiconductor nanowire 120. Detailed configuration of the second dopant may be understood from the descriptions made with reference to FIG. 1.

According to the method of manufacturing the integrated circuit device 100A, described with reference to FIGS. 8A to 8I, a gate length that is precisely controlled in a self-alignment manner may be provided using a crystal phase superstructure in which ZB and WZ crystal phases are regularly arranged in a compound semiconductor nanowire 120, and thus, a problem such as performance degradation according to the distribution of gate lengths in the integrated circuit device may be circumvented, and improved reliability and performance may be realized. Also, in forming the wiring layer 150 that is connected to the gate electrode GE1, a relatively big alignment margin between the wiring layer 150 and the gate electrode GE1 may be obtained, and thus, alignment precision for connection between the wiring layer 150 and the gate electrode GE1 may be more easily obtained even without applying an overly strict process condition.

Figure 9A:
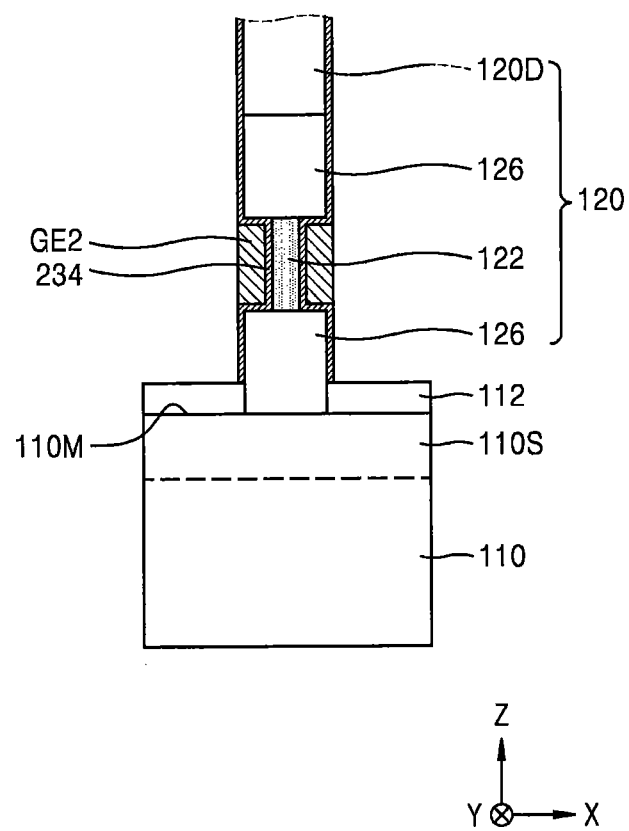
FIGS. 9A and 9B are cross-sectional views illustrating methods of manufacturing integrated circuit devices according to other embodiments of the inventive concepts.
Figure 9B:
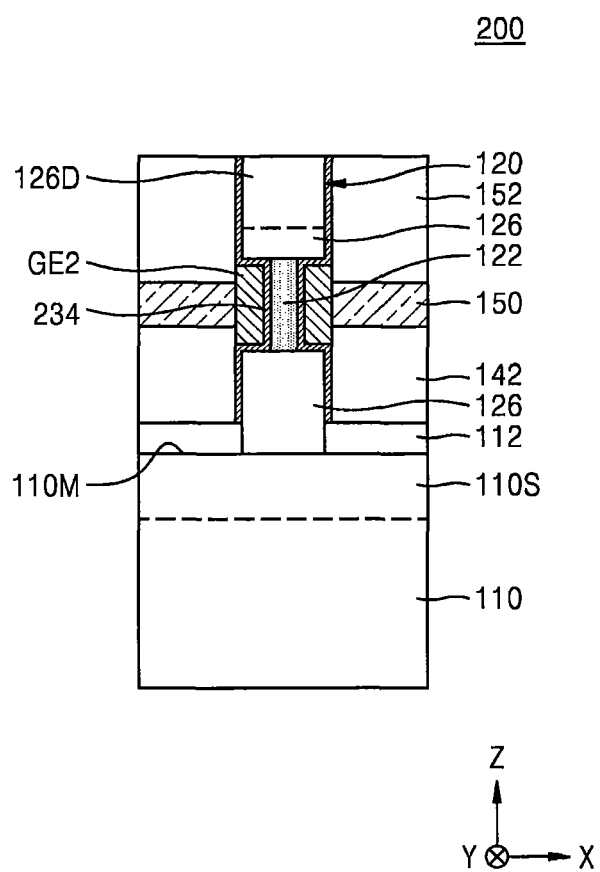

FIGS. 9A and 9B are cross-sectional views illustrating methods of manufacturing integrated circuits device according to other embodiments of the inventive concepts. An example manufacturing method of the integrated circuit device 200 illustrated in FIG. 4 will be described with reference to FIGS. 9A and 9B. In FIGS. 9A and 9B, elements that are the same or similar as those in FIGS. 1 to 4 are designated by the same reference numerals, and repeated descriptions thereof are omitted.

Referring to FIG. 9A, the gate dielectric layer 135 covering the compound semiconductor nanowire 120 and the gate electrode forming conductive layer GEL may be formed by performing the processes described with reference to FIGS. 8A to 8E, and, subsequently, anisotropic dry etching may be performed on the conductive layer GEL and the gate dielectric layer 135 as described above with reference to FIG. 8F. However, in the present example, the anisotropic dry etching process of the conductive layer GEL and the gate dielectric layer 135 may be performed so that not only portions of the gate dielectric layer 135 that are in the space SP around the first section 122 of the compound semiconductor nanowire 120, but also portions of the gate dielectric layer 135 that cover an external side wall of the compound semiconductor nanowire 120 (i.e., the external side wall including an external side wall of the second section 126) may be left on the substrate 110.

As a result, as illustrated in FIG. 9A, the gate dielectric layer 234 extending along an external wall of the compound semiconductor nanowire 120 may be obtained from the gate dielectric layer 135 illustrated in FIG. 8E. Also, the gate electrode GE2 covering the first section 122 of the compound semiconductor nanowire 120 may be obtained from the conductive layer GEL illustrated in FIG. 8E. An external side wall of the gate electrode GE2 may be formed to extend aligned with an external side wall of a portion of the gate dielectric layer 234 that covers a side wall of the second section 126.

Referring to FIG. 9B, the integrated circuit device 200 may be formed by performing processes similar to those described with reference to FIGS. 8G to 8I on a result of FIG. 9A.

Although example manufacturing methods of the integrated circuit devices 100A and 200 illustrated in FIGS. 3 and 4 have been described above with reference to FIGS. 8A to 9B, it would be understood by one of ordinary skill in the art that the integrated circuit devices 300 and 400 illustrated in FIGS. 5 and 6 or integrated circuit devices of various structures that are modified and changed from the integrated circuit devices 300 and 400 may be manufactured by incorporating various modifications and changes in the descriptions made with reference to FIGS. 8A to 9B within the scope of the inventive concepts.

In an example, in order to manufacture the integrated circuit device 300 illustrated in FIG. 5, the processes described with reference to FIGS. 8A to 8I may be performed. However, during the process described with reference to FIG. 8C, in order to prepare the space SP around the first section 122 having a decreased width, wherein the space SP has a vertical length limited by the pair of second sections 126, while a portion of the first section 122 is etched, an etch selectivity may be adjusted to remove an edge portion of the pair of second sections 126 as well. As a result, as the space SP is formed, a portion, from among the pair of second sections 126 respectively adjoining both ends of the first section 122, that is adjacent to the first section 122 may be removed, and thus, the truncated shape portion 326T having a decreasing width so as to have a decreasing cross-section area toward the first section 122 in an end portion of respective ones of the pair of second sections 126 that adjoins the first section 122 may be left as illustrated in FIG. 5. In some embodiments, after the space SP is formed, a horizontal width of the pair of second sections 126 may be minutely decreased. Afterwards, the integrated circuit device 300 having the structure illustrated in FIG. 5 may be manufactured by performing the processes described with reference to FIGS. 8D to 8I.

In another example, in order to manufacture the integrated circuit device 400 illustrated in FIG. 6, the processes described with reference to FIGS. 9A and 9B may be performed. However, as in the manufacturing process of the integrated circuit device 300 having the structure illustrated in FIG. 5, during the process described with reference to FIG. 8C, in order to prepare the space SP around the first section 122 having a decreased width, (wherein the space SP has a vertical length limited by the pair of second sections 126), while a portion of the first section 122 is etched, an etch selectivity may be adjusted to remove an edge portion of the pair of second sections 126 as well. As a result, as the space SP is formed, a portion, from among the pair of second sections 126 respectively adjoining both ends of the first section 122, that is adjacent to the first section 122 may be removed, and thus, the truncated shape portion 426T having a decreasing width so as to have a decreasing cross-section area toward the first section 122 in an end portion of respective ones of the pair of second sections 126 that adjoins the first section 122 may be left as illustrated in FIG. 6. Afterwards, the integrated circuit device 400 having the structure illustrated in FIG. 6 may be manufactured by performing the processes described with reference to FIGS. 8D to 8I and 9A to 9B.

Figure 10A:
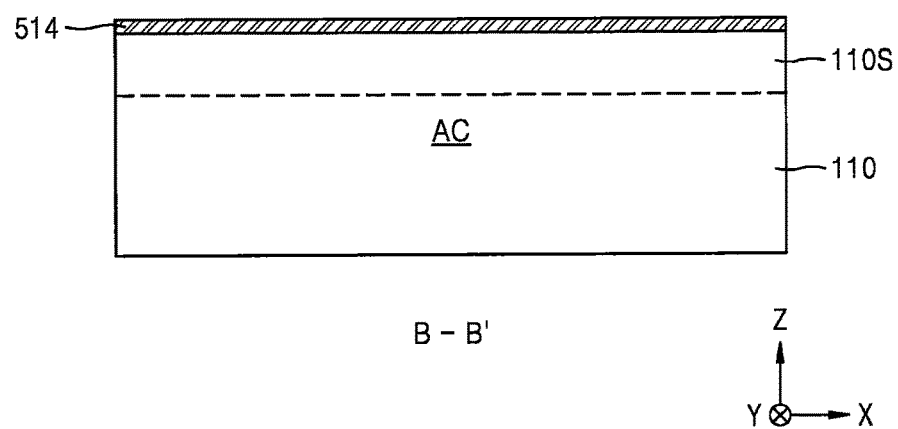
FIGS. 10A to 15B are cross-sectional views illustrating methods of manufacturing integrated circuit devices according to other embodiments of the inventive concepts, wherein FIGS. 10A, 11A, . . . , 15A are cross-sectional views of a portion corresponding to a cross-section taken along line B-B' of FIG. 7A, and FIGS. 10B, 11B, . . . , 15B are cross-sectional views of a portion corresponding to a cross-section taken along line C-C' of FIG. 7A.
Figure 10B:
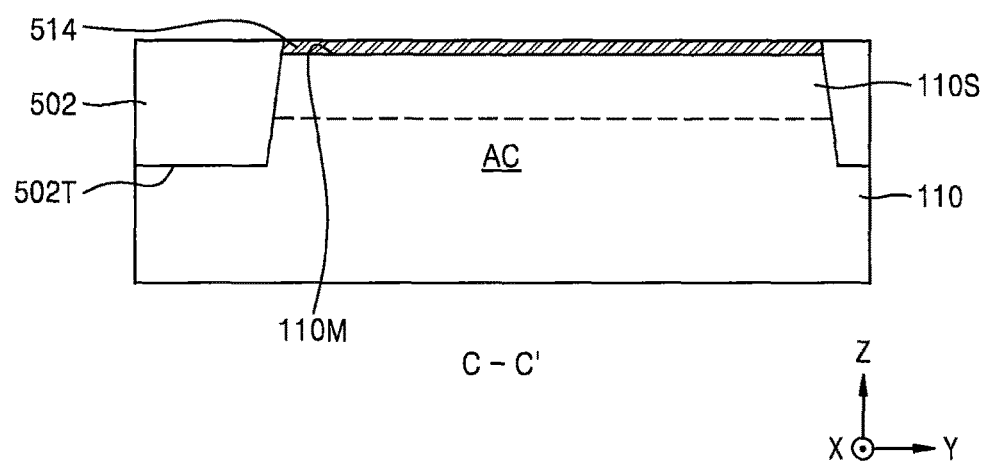
Figure 11A:
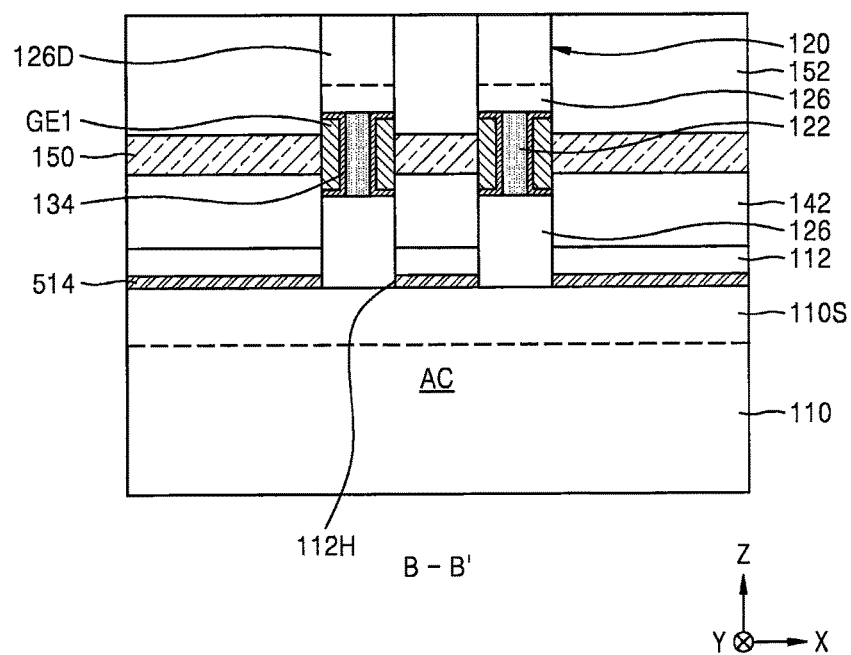
Figure 11B:
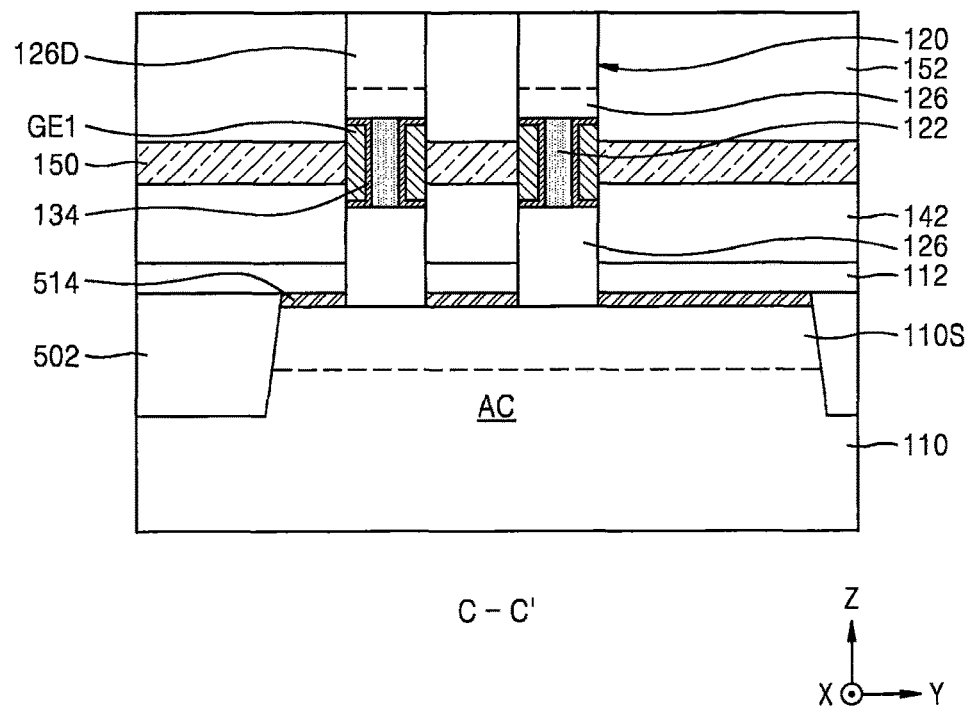

FIGS. 10A to 15B are cross-sectional views illustrating methods of manufacturing integrated circuits device according to other embodiments of the inventive concepts, wherein FIGS. 10A, 11A, . . . , 15A are cross-sectional views of a portion corresponding to a cross-section taken along line B-B' of FIG. 7A, and FIGS. 10B, 11B, . . . , 15B are cross-sectional views of a portion corresponding to a cross-section taken along line C-C' of FIG. 7A. A method of manufacturing the integrated circuit device 500 illustrated in FIGS. 7A to 7C will be described with reference to FIGS. 10A to 15B. In FIGS. 10A to 15B, elements that are the same or similar as those in FIGS. 1 to 9B are designated by the same reference numerals, and repeated descriptions thereof are omitted.

Referring to FIGS. 10A and 10B, as described above with reference to FIG. 8A, the substrate 110 having the main surface 110M that is a {111} crystal plane may be prepared, and the source region 110S may be formed by implanting a first dopant into the substrate 110 from the main surface 110M of the substrate 110. Afterwards, the metal silicide film 514 may be formed on the main surface 110M of the substrate 110.

Afterwards, a device isolating trench 502T for defining the active region AC may be formed by etching a partial region of the substrate 110, and the device isolation film 502 may be formed by filling the device isolating trench 502T with an insulation layer.

Referring to FIGS. 11A and 11B, the insulation mask layer 112 including a plurality of holes 112H may be formed on the substrate 110. In some embodiments, the plurality of holes 112H may extend through the insulation mask layer 112 and the metal silicide film 514 to expose the main surface 110M of the substrate 110. Subsequently, as described above with reference to FIG. 8B, the plurality of compound semiconductor nanowires 120 including Group III-V materials may be grown from the main surface 110M of the substrate 110 that is exposed via the plurality of holes 112H.

Afterwards, processes similar to those described with reference to FIGS. 8C to 8I may be performed on the plurality of compound semiconductor nanowires 120, and thus, the gate dielectric layer 134 and the gate electrode GE1 around the plurality of compound semiconductor nanowires 120, which sequentially surround the first section 122, may be formed, the lower insulation spacer 142, the wiring layer 150, and the upper insulation spacer 152 around the plurality of compound semiconductor nanowires 120, which are sequentially stacked on the substrate 110, may be formed, and the drain region 126D may be formed by implanting a second dopant into the second section 126 that is exposed at the top surface of each of the plurality of compound semiconductor nanowires 120.

Figure 12A:
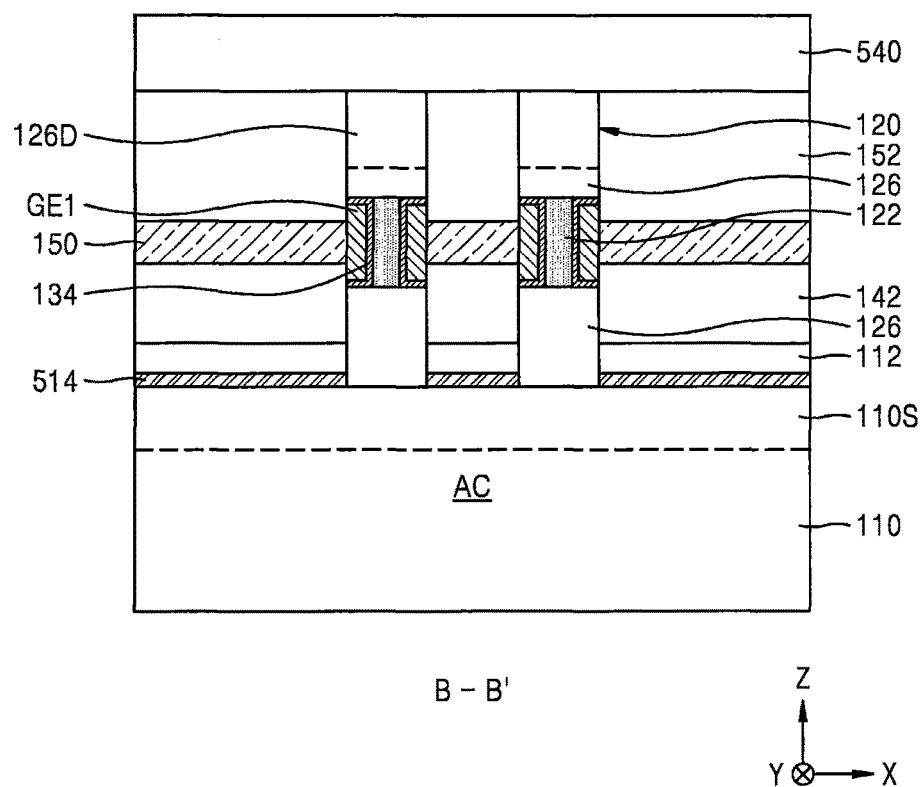
Figure 12B:
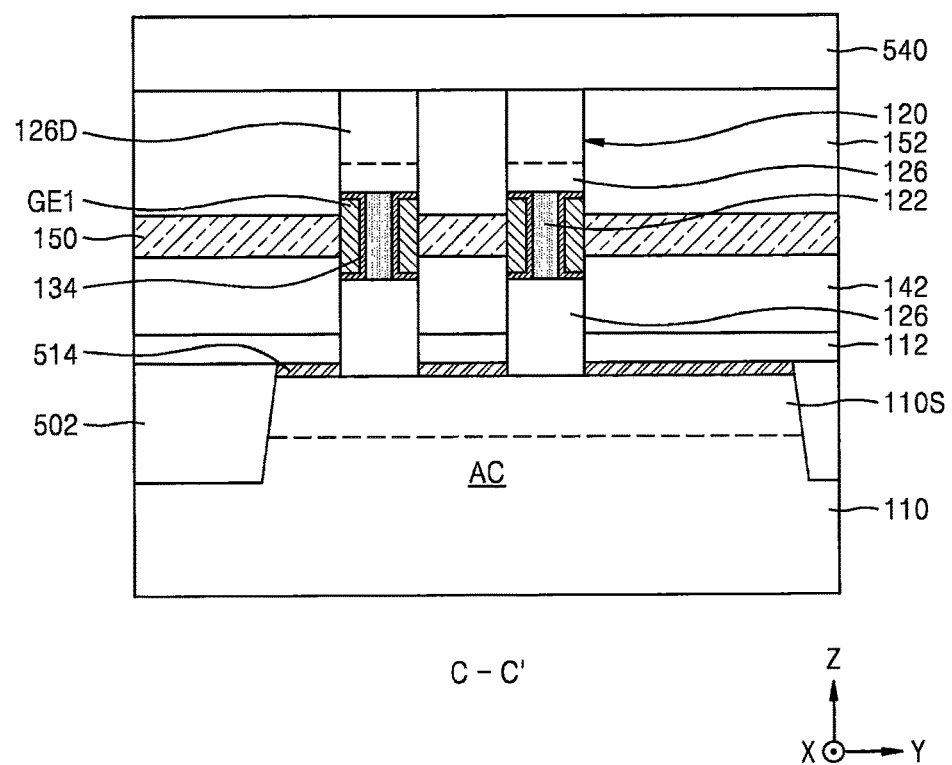

Referring to FIGS. 12A and 12B, the upper insulation layer 540 covering the upper insulation spacer 152 and the drain region 126D may be formed on a result of FIGS. 11A and 11B.

Figure 13A:
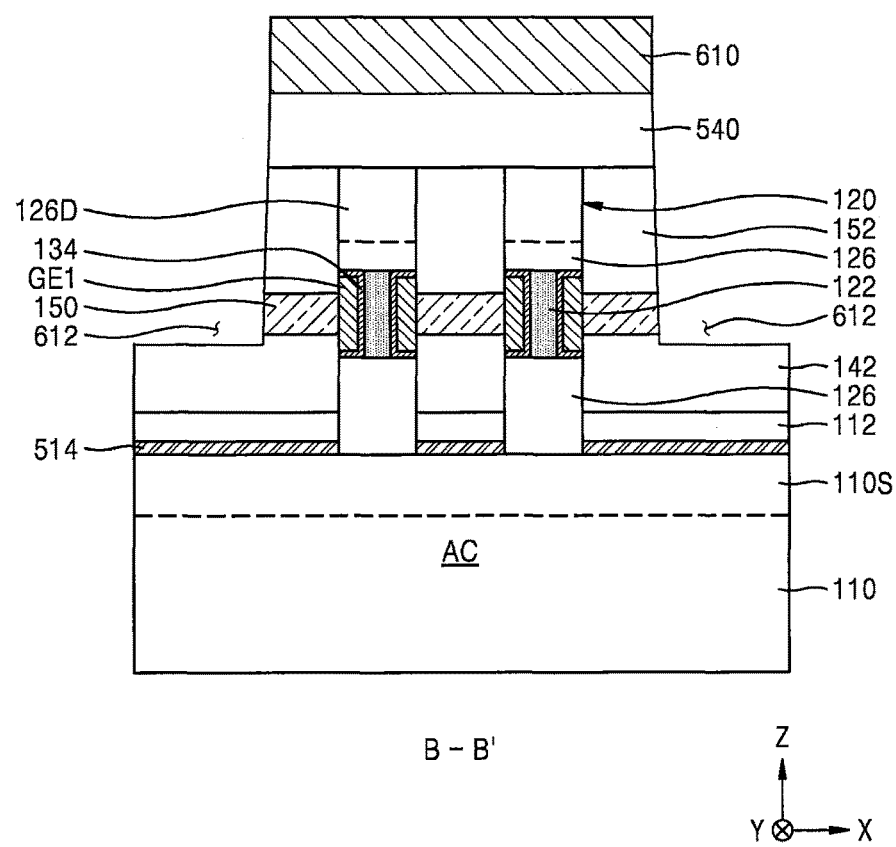
Figure 13B:
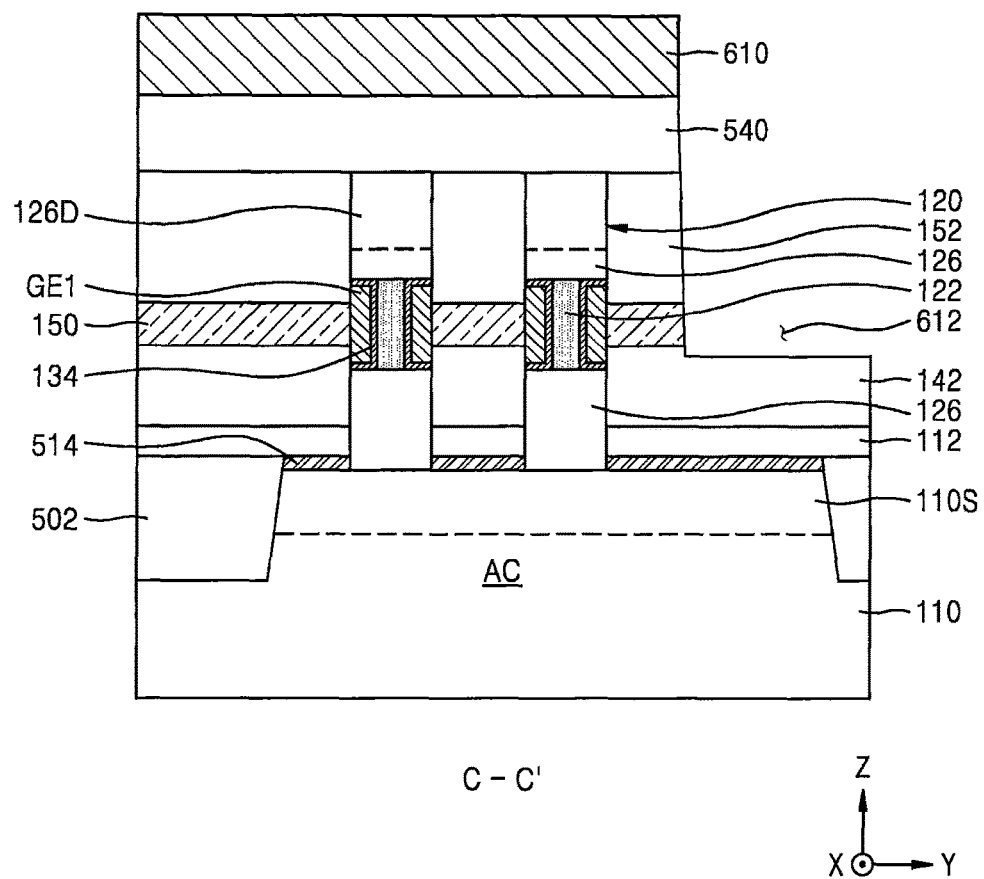

Referring to FIGS. 13A and 13B, a mask pattern 610 may be formed on the upper insulation layer 540, and then, using the mask pattern 610 as an etching mask, anisotropic dry etching may be performed on the upper insulation layer 540, the upper insulation spacer 152, and the wiring layer 150 sequentially to expose the lower insulation spacer 142. As a result, a trench 612 that limits horizontal widths of the wiring layer 150 and the upper insulation spacer 152 may be formed. The wiring layer 150 remaining above the substrate 110 may contact the plurality of gate electrodes GE1 while being around the plurality of compound semiconductor nanowires 120 and may extend parallel to the substrate 110 while having a plane shape illustrated in FIG. 7A.

The mask pattern 610 may include, for example, a photoresist film, an oxide film, a nitride film, an oxynitride film, a polysilicon film, or a combination thereof.

While the upper insulation layer 540, the upper insulation spacer 152, and the wiring layer 150 are sequentially etched using the mask pattern 610 as an etching mask, the lower insulation spacer 142 may be partially etched by over-etching.

Figure 14A:
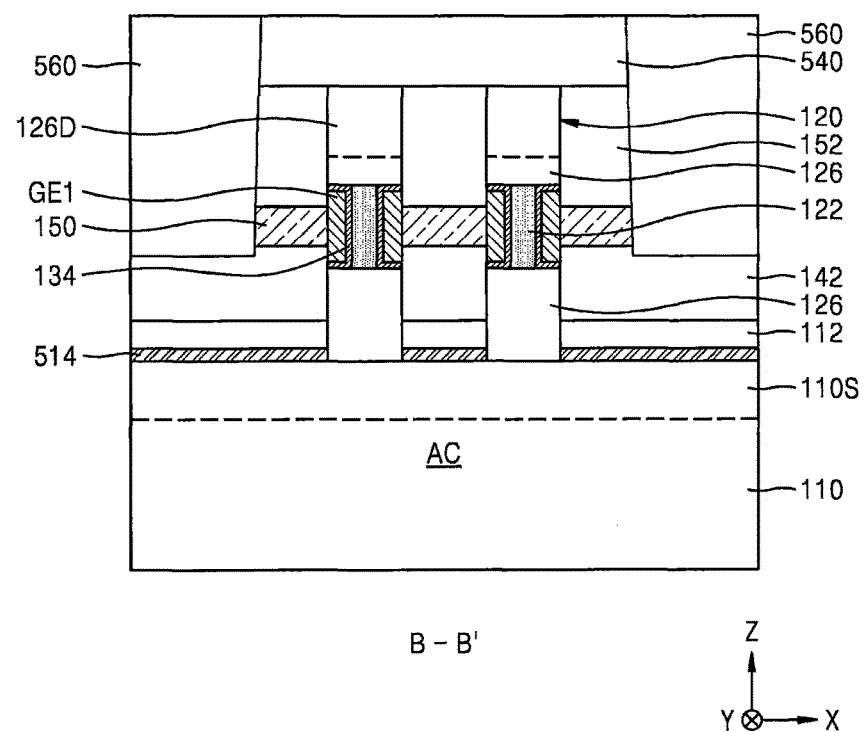
Figure 14B:
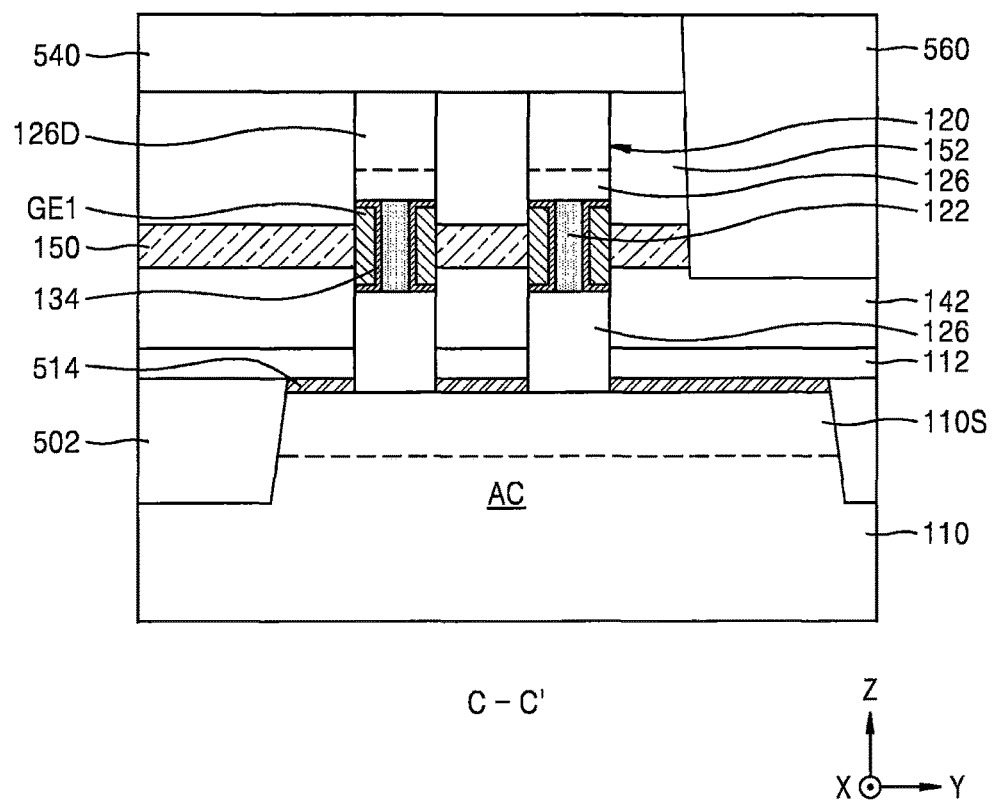

Referring to FIGS. 14A and 14B, the mask pattern 610 (refer to FIGS. 13A and 13B) may be removed, and then, the trench 612 around the wiring layer 150 may be filled with an insulation material to form the buried insulation layer 560.

In some embodiments, in order to form the buried insulation layer 560, an insulation layer that covers the upper insulation layer 540 while filling the trench 612 in a thickness sufficient to fill the trench 612 may be formed, and then, the insulation layer may be polished or etched back, until the top surface of the upper insulation layer 540 is exposed, to obtain the buried insulation layer 560 having a planarized top surface. The top surface of the buried insulation layer 560 and the top surface of the upper insulation layer 540 may extend on the same level. In some embodiments, the top surface of the buried insulation layer 560 and the top surface of the upper insulation layer 540 may be coplanar.

Figure 15A:
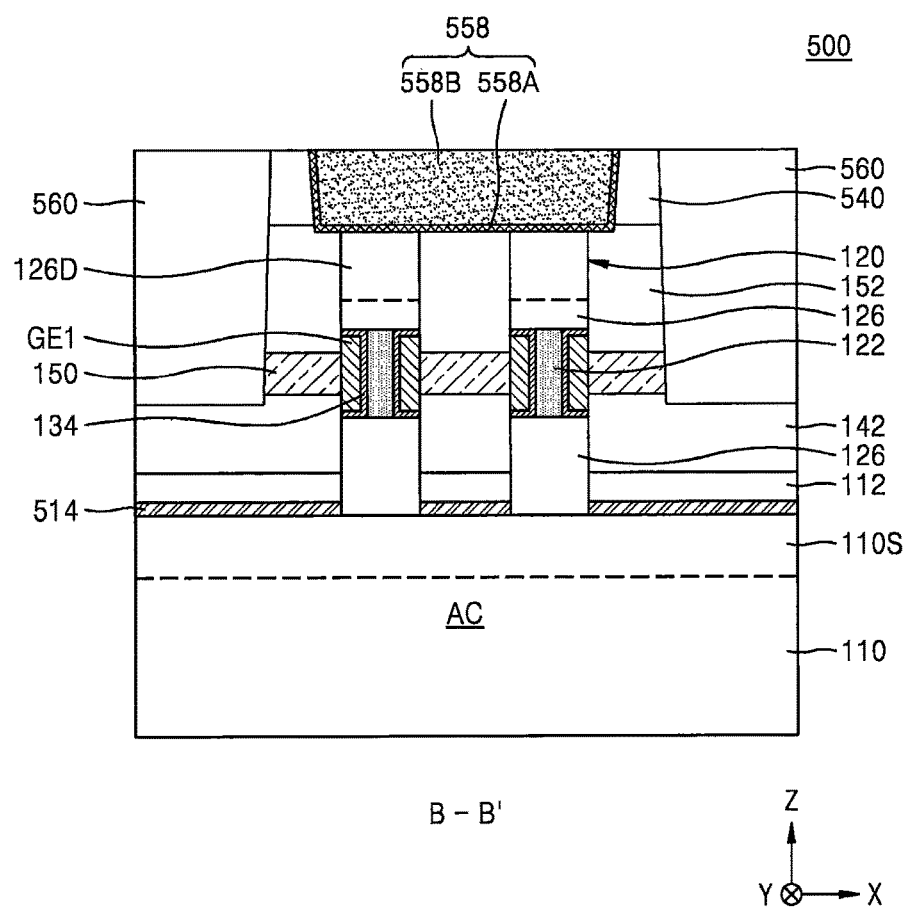
Figure 15B:
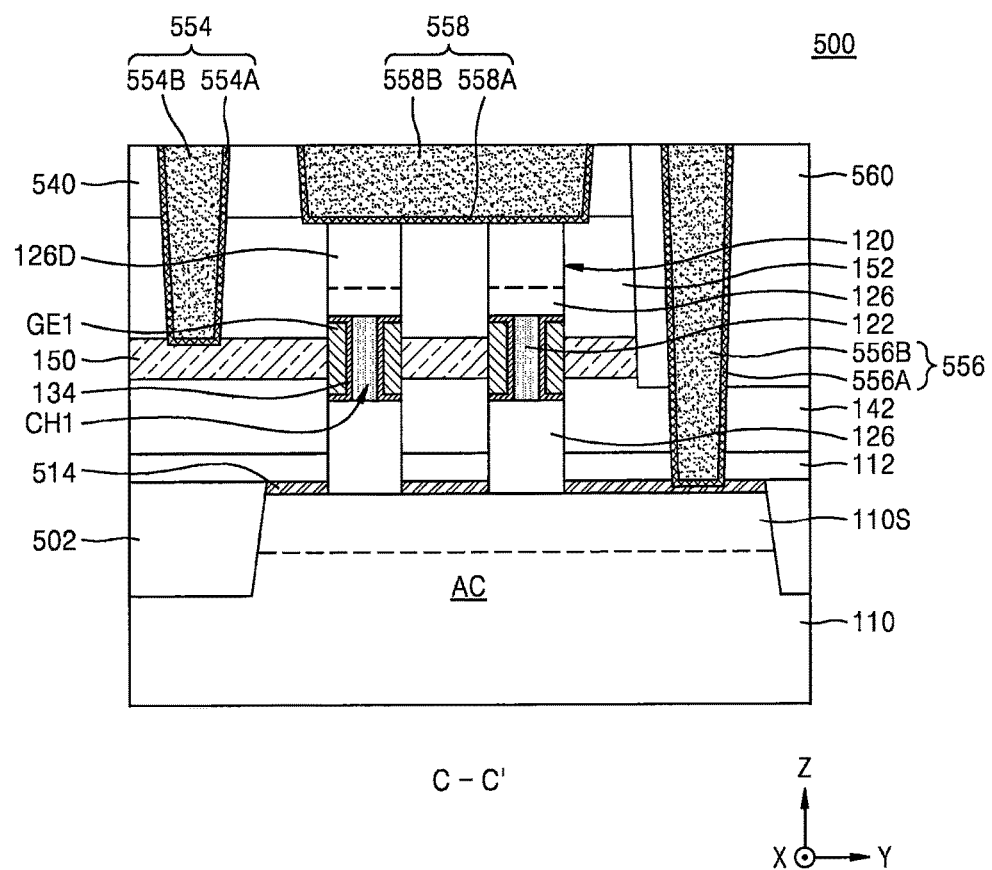

Referring to FIGS. 15A and 15B, the first conductive contact plug 554 that penetrates the upper insulation spacer 152 and the upper insulation layer 540 and is connected to the wiring layer 150, the second conductive contact plug 556 that penetrates the insulation mask layer 112, the lower insulation spacer 142, and the buried insulation layer 560 and is connected to the source region 110S via the metal silicide film 514, and the top contact conductive layer 558 that penetrates the upper insulation layer 540 and is connected to the drain region 126D may be formed. As illustrated in FIG. 7A, one top contact conductive layer 558 may be formed to cover all of the plurality of drain regions 126D formed above one active region AC.

In some embodiments, the first conductive contact plug 554, the second conductive contact plug 556, and the top contact conductive layer 558 may be sequentially formed by separate photolithography processes, respectively. In some embodiments, at least two of the first conductive contact plug 554, the second conductive contact plug 556, and the top contact conductive layer 558 may be simultaneously formed by a single photolithography process.

Although methods of manufacturing example integrated circuit devices according to embodiments of the inventive concepts have been described above with reference to FIGS. 8A to 15B, it would be understood by one of ordinary skill in the art that integrated circuit devices of various structures that are modified and changed from the integrated circuit devices described herein and illustrated in the accompanying drawings may be manufactured by incorporating various modifications and changes in the above descriptions within the scope of the inventive concepts.

Using methods of manufacturing integrated circuit devices according to the inventive concepts, a gate length that is precisely controlled in a self-alignment manner may be provided using a crystal phase superstructure in which ZB and WZ crystal phases are regularly arranged in a nanowire, and thus, a problem such as performance degradation according to the distribution of gate lengths in the integrated circuit device may be reduced or circumvented, and improved reliability and performance may be realized. Also, in forming a wiring layer that is connected to a gate electrode, a relatively big alignment margin between the wiring layer and the gate electrode may be obtained, and thus, alignment precision for connection between the wiring layer and the gate electrode may be more easily obtained even without applying an overly strict process condition.

Figure 16:
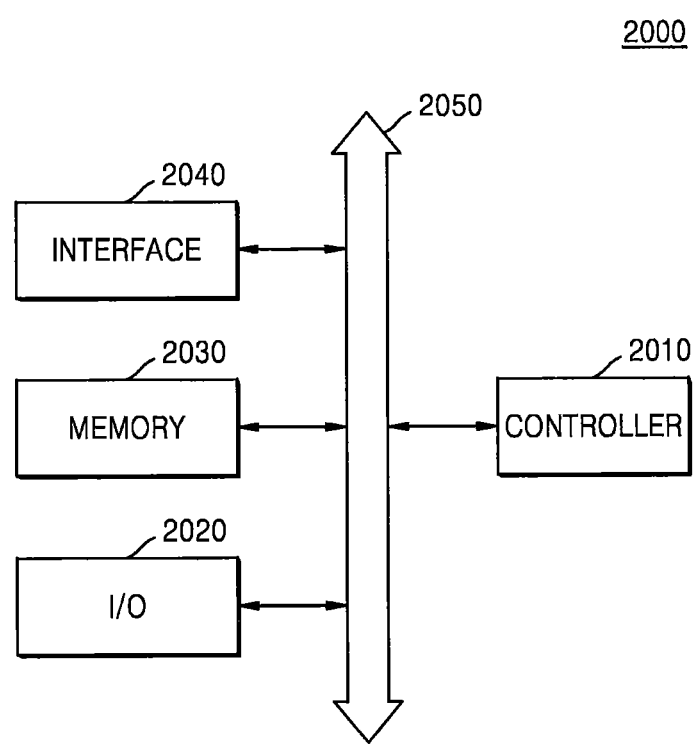
FIG. 16 is a block diagram of an electronic system including an integrated circuit device according to embodiments of the inventive concepts.

FIG. 16 is a block diagram of an electronic system 2000 including an integrated circuit device according to embodiments of the inventive concepts.

The electronic system 2000 may include a controller 2010, an input/output apparatus (I/O) 2020, a memory 2030, and an interface 2040, which may be connected to each other via a bus 2050.

The controller 2010 may include at least one of a microprocessor, a digital signal processor, and/or another similar processor. The I/O 2020 may include at least one of a keypad, a keyboard, and/or a display. The memory 2030 may be used to store a command executed by the controller 2010. For example, the memory 2030 may be used to store user data.

The electronic system 2000 may configure a wireless communication apparatus, or an apparatus capable of transmitting and/or receiving information in wireless settings. In order to transmit/receive data via a wireless communication network in the electronic system 2000, the interface 2040 may be configured as a wireless interface. The interface 2040 may include an antenna and/or a wireless transceiver. In some embodiments, the electronic system 2000 may be used in a communication interface protocol of a third-generation communication system, for example, code division multiple access (CDMA), global system for mobile communications (GSM), north American digital cellular (NADC), extended-time division multiple access (E-TDMA) and/or wide band code division multiple access (WCDMA). The electronic system 2000 includes at least one of integrated circuit devices according to embodiments, for example, the integrated circuit devices 100, 100A, 200, 300, 400, and 500 illustrated in FIGS. 1 to 7C, and integrated circuit devices of various structures that are modified and changed from the aforementioned integrated circuit devices within the scope of the inventive concepts.

As used herein, the singular terms "a," "an," and "the" are intended to include the plural forms as well, unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "on" another element, it can be directly on the other element or intervening elements may be present. In contrast, the term "directly" means that there are no intervening elements. Additionally, the embodiments in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes.

While such terms as "first," "second," etc., may be used to describe various components, such components must not be limited to the above terms. The above terms are used only to distinguish one component from another. For example, a first component discussed below could be termed a second component, and similarly, a second component may be termed a first component without departing from the teachings of this disclosure.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Integrated circuit devices according to the inventive concepts may include a transistor that uses, as a channel, a compound semiconductor nanowire capable of greatly decreasing a short-channel effect and power consumption. Accordingly, there may be provided a next-generation integrated circuit device that may exceed, with a fast carrier movement rate, the limit of silicon semiconductors. Also, a gate length that is precisely controlled in a self-alignment manner may be provided using a crystal phase superstructure in which ZB and WZ crystal phases are regularly arranged in the compound semiconductor nanowire, and thus, a problem such as performance degradation according to the distribution of gate lengths in the integrated circuit device may be reduced or circumvented, and improved reliability and performance may be realized.

While the inventive concepts have been particularly shown and described with reference to embodiments thereof, it will be understood that various changes in form and details may be made therein without departing from the spirit and scope of the following claims.

What is claimed is:

1. An integrated circuit device comprising:
a substrate comprising a main surface;
a compound semiconductor nanowire extending from the main surface in a first direction perpendicular to the main surface and comprising a first section and a second section alternately arranged in the first direction, wherein the first section and the second section have the same composition as each other and have different crystal phases from each other;
a gate electrode covering the first section; and
a gate dielectric layer between the first section and the gate electrode.

2. The integrated circuit device of claim 1, wherein the substrate comprises a Group IV material or a Group III-V material, and
the main surface has a {11} crystal plane.

3. The integrated circuit device of claim 1, wherein the compound semiconductor nanowire comprises a Group III-V material.

4. The integrated circuit device of claim 1, wherein the compound semiconductor nanowire comprises at least one Group III element selected from indium (In), gallium (Ga), and aluminum (Al) and at least one Group V element selected from arsenic (As), phosphorus (P), and antimony (Sb), and
the first section and the second section have the different crystal phases respectively selected from a zinc-blende (ZB) crystal phase and a wurtzite (WZ) crystal phase.

5. The integrated circuit device of claim 1, wherein the compound semiconductor nanowire comprises two second sections that are in a pair respectively adjoining both ends of the first section with the first section in the middle,
wherein the first section has a first width in a second direction parallel to the main surface of the substrate, and
wherein the pair of second sections respectively have a second width in the second direction, wherein the second width is greater than the first width.

6. The integrated circuit device of claim 1, wherein the gate electrode has an annular shape surrounding the first section.

7. The integrated circuit device of claim 1, further comprising:
a source region in the substrate, the source region comprising a first dopant; and
a drain region in a portion of the compound semiconductor nanowire, the drain region comprising a second dopant,
wherein the first dopant and the second dopant comprise different elements from each other.

8. The integrated circuit device of claim 7, wherein the drain region is in the second section.

9. The integrated circuit device of claim 7, further comprising a conductive contact plug extending from the source region in the first direction so as to be parallel to the compound semiconductor nanowire.

10. The integrated circuit device of claim 1, further comprising a wiring layer contacting the gate electrode and extending parallel to the main surface of the substrate at a same level as that of the first section on the substrate.

11. An integrated circuit device comprising:
a substrate comprising a main surface;
a compound semiconductor nanowire extending from the main surface in a first direction perpendicular to the main surface and comprising a lower second section, a first section on the lower second section, and an upper second section on the first section,
wherein the first section has a different crystal phase from the upper second section and the lower second section;
a gate electrode on the first section,
wherein a portion of the gate electrode is between, in the first direction, the upper second section and the lower second section.

12. The integrated circuit device of claim 11, wherein the crystal phases of the first section, the upper second section, and the lower second section are selected from a zinc-blende (ZB) crystal phase and a wurtzite (WZ) crystal phase.

13. The integrated circuit device of claim 11, further comprising a gate dielectric layer between the first section and the gate electrode and covering sidewalls of the upper second section and the lower second section.

14. The integrated circuit device of claim 11, further comprising a wiring layer contacting the gate electrode and extending in a direction that is substantially parallel to the main surface of the substrate and substantially perpendicular to the first section.

15. The integrated circuit device of claim 11, wherein respective ends of the upper second section and the lower second section that are closest to the first section have a truncated shape having a decreasing width so as to have a decreasing cross-section area toward the first section.

* * * * *